(12) United States Patent
Sato et al.

(10) Patent No.: US 11,088,512 B2
(45) Date of Patent: Aug. 10, 2021

(54) NITRIDE SEMICONDUCTOR ELEMENT

(71) Applicant: ASAHI KASEI KABUSHIKI KAISHA, Tokyo (JP)

(72) Inventors: Kosuke Sato, Tokyo (JP); Motoaki Iwaya, Nagoya (JP); Shinji Yasue, Nagoya (JP); Yuya Ogino, Nagoya (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 11 days.

(21) Appl. No.: 16/807,199

(22) Filed: Mar. 3, 2020

(65) Prior Publication Data
US 2020/0287354 A1 Sep. 10, 2020

(30) Foreign Application Priority Data

Mar. 7, 2019 (JP) .............................. JP2019-042048
Jan. 7, 2020 (JP) .............................. JP2020-000817

(51) Int. Cl.
*H01S 5/00* (2006.01)
*H01S 5/32* (2006.01)
(Continued)

(52) U.S. Cl.
CPC .............. *H01S 5/3215* (2013.01); *H01S 5/22* (2013.01); *H01S 5/3213* (2013.01);
(Continued)

(58) Field of Classification Search
CPC ...... H01S 5/22; H01S 5/34343; H01S 5/3215; H01S 5/3213; H01S 5/2009; H01S 5/2031; H01S 5/1039; H01S 5/04257; H01S 5/34
See application file for complete search history.

(56) References Cited

U.S. PATENT DOCUMENTS

2006/0193359 A1* 8/2006 Kuramoto ................ H01S 5/20
372/45.01
2009/0045438 A1* 2/2009 Inoue ................... H01L 29/0607
257/192
(Continued)

FOREIGN PATENT DOCUMENTS

JP  2016-171127 A  9/2016
JP  2018-098401 A  6/2018

*Primary Examiner* — Kinam Park
(74) *Attorney, Agent, or Firm* — Morgan, Lewis & Bockius LLP

(57) ABSTRACT

This invention aims at providing a nitride semiconductor causing no element breakdown even in driving under a high current density.
A nitride semiconductor element is provided with a nitride semiconductor active layer made of $Al_xGa_{(1-x)}N$ and a composition change layer made above the nitride semiconductor active layer and made of $Al_{x3}Ga_{(1-x3)}N$ in which an Al composition ratio x3 decreases in a direction away from the nitride semiconductor active layer. The composition change layer has a first composition change region having a thickness larger than 0 nm and smaller than 400 nm and a second composition change region which is a region further away from the nitride semiconductor active layer than the first composition change region and in which the change rate of the Al composition ratio x3 in the thickness direction of the film thickness of the composition change layer is higher than that of the first composition change region, in which, in the first composition change region, the Al composition ratio continuously changes in the thickness direction of the film thickness.

20 Claims, 7 Drawing Sheets

(51) Int. Cl.
    *H01S 5/343*     (2006.01)
    *H01S 5/22*     (2006.01)
    *H01S 5/042*     (2006.01)
    *H01S 5/028*     (2006.01)
    *H01S 5/10*     (2021.01)
    *H01S 5/20*     (2006.01)
    *H01S 5/34*     (2006.01)

(52) U.S. Cl.
    CPC ........ *H01S 5/34333* (2013.01); *H01S 5/0287* (2013.01); *H01S 5/04257* (2019.08); *H01S 5/1039* (2013.01); *H01S 5/2009* (2013.01); *H01S 5/2031* (2013.01); *H01S 5/34* (2013.01); *H01S 5/34346* (2013.01)

(56) References Cited

U.S. PATENT DOCUMENTS

2015/0280056 A1\* 10/2015 Northrup ............ H01L 33/0075
                                                    257/13
2016/0268477 A1\* 9/2016 Fujita .................... H01L 33/007

\* cited by examiner

NITRIDE SEMICONDUCTOR ELEMENT

BACKGROUND OF THE INVENTION

Field of the Invention

The present invention relates to a nitride semiconductor element.

Description of the Related Art

A nitride semiconductor light emitting element having a p-type cladding layer formed of AlGaN in which the Al composition decreases in the thickness direction is known (for example, PTLS 1 and 2). PTL 1 discloses that the threshold current density and the threshold voltage at which laser oscillation occurs are reduced by setting the Al composition of the p-type AlGaN cladding layer to a composition gradient layer. PTL 2 discloses that a Group III nitride semiconductor light emitting element having a long life can be obtained by setting the Al composition of the p-type cladding layer to decrease over the entire thickness of the p-type cladding layer from an electron blocking layer side toward a p-type contact layer side and setting the decrease rate in the thickness direction of the Al composition of the p-type cladding layer to 0.01/nm or more and 0.025/nm or less.

Moreover, in the nitride semiconductor light emitting element, e.g., light emitting diode (LED), a large current is caused to flow in order to achieve a high output in some cases. Alternatively, the size of the element is reduced in order to achieve a cost reduction in some cases. In a laser diode, for example, the electrode area is reduced in order to increase the current density in some cases. In any case, an element durable for driving at a higher current density is required. In order to realize the laser oscillation of ultraviolet light having a wavelength of less than 380 nm, driving at a current density higher than that in a longer wavelength nitride semiconductor laser diode is indispensable. This is because the growth of a high quality AlGaN thin film is difficult to achieve and the growth of AlGaN having a high Al composition of a conductivity type required for confining light is extremely difficult to achieve, and therefore the threshold current density required for the laser oscillation is high. Moreover, in particular, in an assumption from a threshold (several $kW/cm^2$ to several 10 $kW/cm^2$) according to a photoexcitation method of a laser element of 326 nm or less, a current density of at least 1 $kA/cm^2$ or more is the minimum requirement required in the laser oscillation. Also in the case of the light emitting diode, in order to achieve both the size reduction for the cost reduction and the high output by the injection of a high current, the development of an element durable for a current density of 1 $kA/cm^2$ or more has been desired.

CITATION LIST

Patent Literatures

PTL 1: JP 2018-98401 A
PTL 2: JP 2016-171127 A

SUMMARY OF THE INVENTION

It is an object of the present invention to provide a nitride semiconductor element free from element breakdown even in driving under a high current density.

In order to achieve the above-described object, a nitride semiconductor element according to one aspect of the present invention is provided with an active layer and a composition change layer formed above the active layer and made of AlGaN in which the Al composition ratio decreases in a direction away from the active layer, in which the composition change layer has a first composition change region having a thickness larger than 0 nm and smaller than 400 nm and a second composition change region which is a region further away from the active layer than the first composition change region and the change rate of the Al composition ratio in the thickness direction of the film thickness of the composition change layer is higher than that of the first composition change region and, in the first composition change region, the Al composition ratio continuously changes in the thickness direction of the film thickness.

One aspect of the present invention can develop an element free from element breakdown even in driving under a high current density.

DESCRIPTION OF THE PREFERRED EMBODIMENTS

First Embodiment

A nitride semiconductor element according to a first embodiment which is an example of the present invention can perform laser oscillation by current injection of ultraviolet light. Therefore, the nitride semiconductor element according to this embodiment is applicable to a laser diode capable of emitting ultraviolet light. The nitride semiconductor element according to this embodiment can obtain light emission of each region of UVA with a wavelength of 380 to 320 nm, UVB with a wavelength of 320 to 280 nm, and UVC with a wavelength of 280 to 200 nm, for example.

The nitride semiconductor element according to the first embodiment of the present invention is described using FIG. 1 to FIG. 8. First, the schematic configuration of the nitride semiconductor element 1 according to this embodiment is described using FIG. 1 and FIG. 2.

Figure 1:
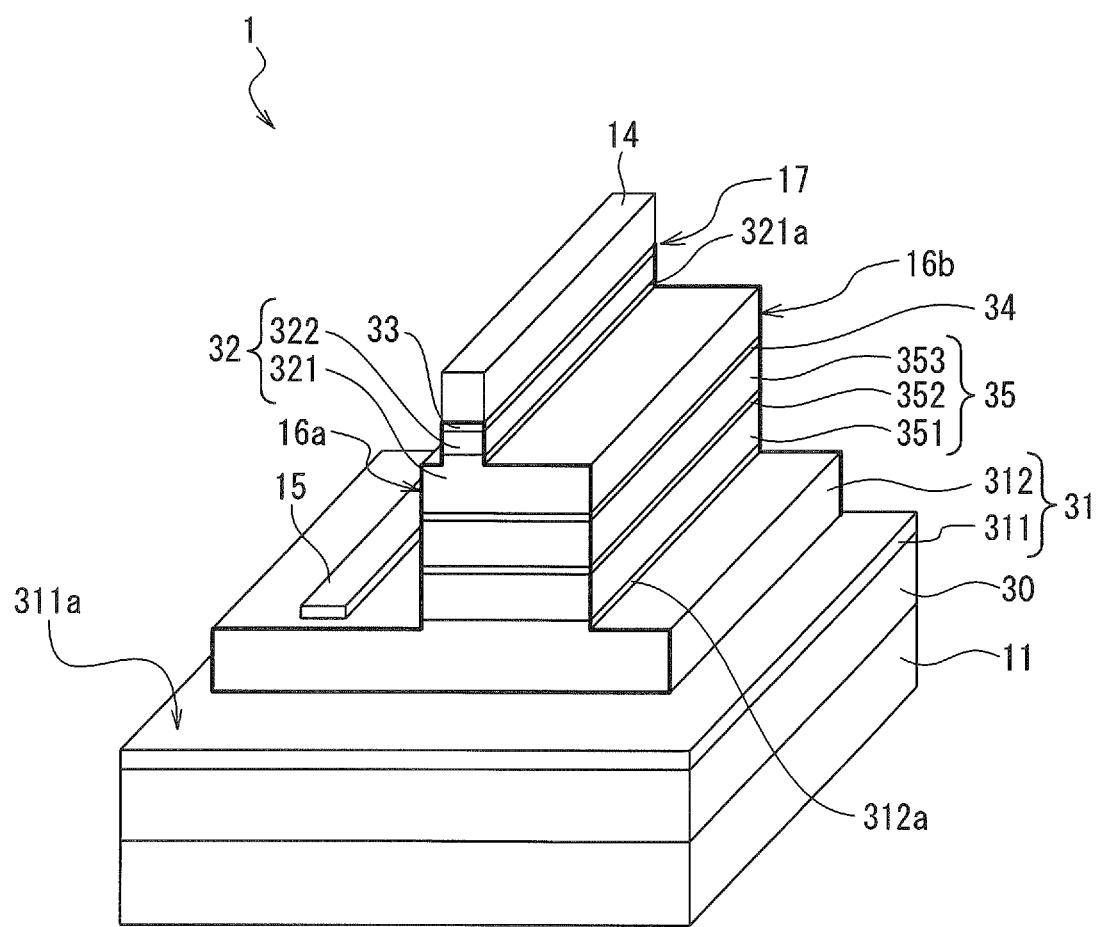
FIG. 1 is a perspective view schematically illustrating an example of the schematic configuration of a nitride semiconductor element according to a first embodiment of the present invention.

As illustrated in FIG. 1, a nitride semiconductor element 1 according to this embodiment is provided with a substrate 11 and a nitride semiconductor active layer (an example of the active layer) 352 provided above the substrate 11 and made of $Al_xGa_{(1-x)}N$. Moreover, the nitride semiconductor element 1 is provided with a composition change layer 32 formed above the nitride semiconductor active layer 352 and made of $Al_{x3}Ga_{(1-x3)}N$ in which an Al composition ratio x3 decreases in a direction away from the nitride semiconductor active layer 352. The composition change layer 32 is also a composition gradient layer in which the Al composition ratio x3 continuously decreases in the direction away from the nitride semiconductor active layer 352. The composition change layer 32 has a first composition change region 321 having a thickness larger than 0 nm and smaller than 400 nm. In the first composition change region 321, the Al composition ratio continuously changes in the thickness direction of the film thickness. The first composition change region 321 may contain Mg. When Mg is contained, Mg is injected into the first composition change region 321 with an impurity concentration of $1 \times 10^{18}$ cm$^{-3}$, for example. Moreover, the composition change layer 32 has a second composition change region 322 which is a region further away from the nitride semiconductor active layer 352 than the first composition change region 321 and in which the change rate of the Al composition ratio x3 in the thickness direction of the film thickness of the composition change layer 32 is higher than that of the first composition change region 321. In the second composition change region 322, the Al composition ratio continuously changes in the thickness direction of the film thickness.

The nitride semiconductor element 1 is provided with a first nitride semiconductor layer 31 made of $Al_{x1}Ga_{(1-x1)}N$ on a side where the composition change layer 32 is not disposed among both sides of the nitride semiconductor active layer 352. Herein, the side where the composition change layer 32 is not disposed among both the sides of the nitride semiconductor active layer 352 is a side where the substrate 11 is disposed, for example.

The nitride semiconductor element 1 is provided with a lower guide layer 351 provided between the first nitride semiconductor layer 31 and the nitride semiconductor active layer 352 and made of $Al_{x4}Ga_{(1-x4)}N$ and an upper guide layer 353 provided between the nitride semiconductor active layer 352 and the composition change layer 32 and made of $Al_{x4}Ga_{(1-x4)}N$. The lower guide layer 351, the nitride semiconductor active layer 352, and the upper guide layer 353 are united to configure a light emitting unit 35. The structure of having the upper guide layer 353 and the lower guide layer 351 is generally used for the purpose of confining light in the upper guide layer 353 and lower guide layer 351 and the nitride semiconductor element 1 is a laser diode. The element structure similar to that of the nitride semiconductor element 1 and not having the lower guide layer 351 and the upper guide layer 353 is generally a light emitting diode (LED).

The nitride semiconductor element 1 is provided with an electron blocking layer 34 provided between the first composition change region 321 and the upper guide layer 353. The electron blocking layer 34 is made of $Al_{x6}Ga_{(1-x6)}N$, for example. The electron blocking layer 34 may be provided between the nitride semiconductor active layer 352 and the upper guide layer 353. Alternatively, the electron blocking layer 34 may be inserted so as to divide the lower guide layer 351 into two parts.

The nitride semiconductor element 1 is provided with a second nitride semiconductor layer 33 having a film thickness larger than 0 nm and less than 100 nm and laminated on the composition change layer 32 to be adjacent to the second composition change region 322. The second nitride semiconductor layer 33 is made of $Al_{x2}Ga_{(1-x2)}N$, for example.

The nitride semiconductor element 1 is provided with a first electrode 14 provided in contact with the second nitride semiconductor layer 33 and a second electrode 15 provided in contact with a part of the first nitride semiconductor layer 31.

The nitride semiconductor element 1 is provided with a ridge portion semiconductor layer 17 containing a projection portion 321a formed in a part of the first composition change region 321 provided in the composition change layer 32, a second composition change region 322 provided in the composition change layer 32, and a second nitride semiconductor layer 33. The first electrode 14 is provided on the ridge portion semiconductor layer 17.

The first nitride semiconductor layer 31 has a first lamination portion 311 disposed on the substrate 11 and made of $Al_{x1}Ga_{(1-x1)}N$ and a second lamination portion 312 laminated on the first lamination portion 311 and made of $Al_{x1}Ga_{(1-x1)}N$. The second lamination portion 312 is disposed on a part of an upper surface 311a of the first lamination portion 311. Therefore, a region where the second lamination portion 312 is not formed and a region where the second lamination portion 312 is formed are present on the upper surface 311a of the first lamination portion 311. The second lamination portion 312 may be laminated on the entire surface of the upper surface 311a of the first lamination portion 311. The second lamination portion 312 has a projection portion 312a formed in a part of the surface of the second lamination portion 312.

The nitride semiconductor element 1 is provided with an AlN layer 30 formed between the first nitride semiconductor layer 31 and the substrate 11, i.e., on the substrate 11. The AlN layer 30 is disposed as a base for the purpose of suppressing the occurrence of cracks during film formation of $Al_{x1}Ga_{(1-x1)}N$ which is a formation material of the first nitride semiconductor layer 31 using a vapor phase growth device which is a common thin film growth apparatus. Due to the presence of the AlN layer 30, a compression stress acts on the upper AlGaN layer, and thus the occurrence of a crack in the $Al_{x1}Ga_{(1-x1)}N$ is suppressed.

The nitride semiconductor element 1 is provided with a resonator surface 16a containing at least one side surfaces of the second lamination portion 312, the light emitting unit 35, the electron blocking layer 34, the composition change layer 32, and the second nitride semiconductor layer 33 and provided on the side surface in a direction of emitting light to the outside. More specifically, the resonator surface 16a is configured by the same plane formed by one side surface of the second lamination portion 312, one side surface of the light emitting unit 35, one side surface of the electron blocking layer 34, one side surface of the composition change layer 32, and one side surface of the second nitride semiconductor layer 33. Moreover, the nitride semiconductor element 1 is provided with a rear resonator surface 16b containing at least the side surfaces facing the one side surfaces of the second lamination portion 312, the light emitting unit 35, the electron blocking layer 34, the composition change layer 32, and the second nitride semiconductor layer 33 and provided on the side surface reflecting light reflected on the resonator surface 16a. In FIG. 1, the outline of the rear resonator surface 16b is partially illustrated by the thick line. More specifically, the rear resonator surface 16b is configured by the same plane formed by the other side surface of the second lamination portion 312, the other side surface of the light emitting unit 35, the other side surface of the electron blocking layer 34, the other side surface of the composition change layer 32, and the other side surface of the second nitride semiconductor layer 33.

As described above, the nitride semiconductor element 1 is provided with the substrate 11, the AlN layer 30 laminated on the substrate 11, the first nitride semiconductor layer 31 laminated on the AlN layer 30, the light emitting unit 35 laminated on the first nitride semiconductor layer 31, the electron blocking layer 34 laminated on the light emitting unit 35, the composition change layer 32 laminated on the electron blocking layer 34, the second nitride semiconductor layer 33 laminated on the composition change layer 32, the first electrode 14 formed on the second nitride semiconductor layer 33, and the second electrode 15 formed on the first nitride semiconductor layer 31.

On the AlN layer 30, the first lamination portion 311 of the first nitride semiconductor layer 31 is disposed. On the projection portion 312a of the second lamination portion 312 of the first nitride semiconductor layer 31, the lower guide layer 351 of the light emitting unit 35 is disposed and the second electrode 15 is disposed in a predetermined region where the projection portion 312a of the second lamination portion 312 is not formed. The electron blocking layer 34 is disposed on the upper guide layer 353 configuring the light emitting unit 35. On the second composition change region 322 of the composition change layer 32, the second nitride semiconductor layer 33 is disposed.

Figure 2:
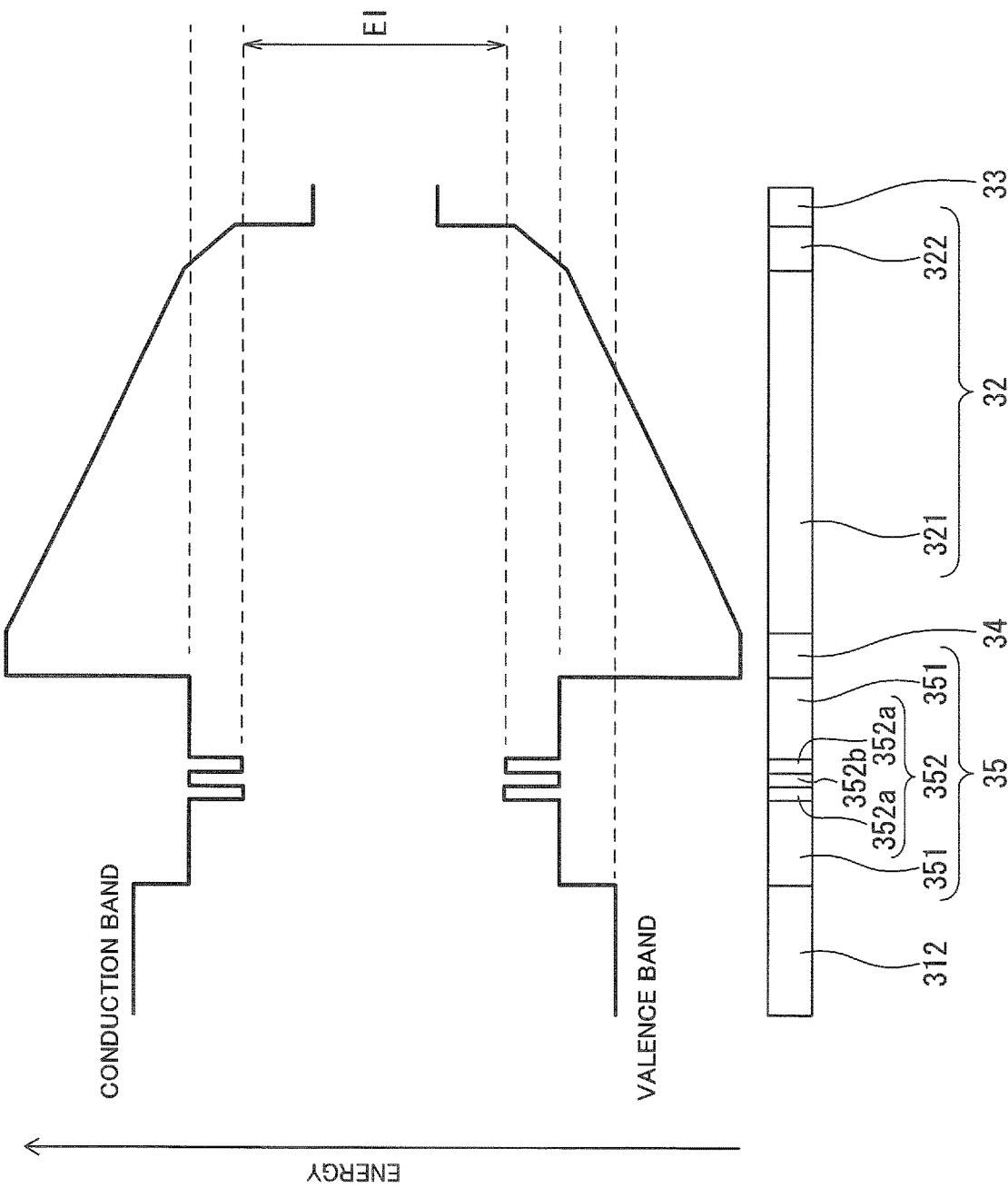
FIG. 2 is a figure schematically illustrating an example of energy bands of the nitride semiconductor element according to the first embodiment of the present invention.

The band gap structure of the nitride semiconductor element 1 having such a laminated structure is described using FIG. 2 referring to FIG. 1. In the upper side in FIG. 2, the energy diagrams of the conduction band and the valence band of the nitride semiconductor element 1 are schematically illustrated. In the lower side in FIG. 2, the laminated structure of the nitride semiconductor element 1 is schematically illustrated in associated with the band gap structure. FIG. 2 schematically illustrates well layers 352a and a barrier layer 352b configuring the nitride semiconductor active layer 352. In FIG. 2, the illustration of a barrier layer provided between the lower guide layer 351 and the well layer 352a and a barrier layer provided between the upper guide layer 353 and the well layer 352a is omitted.

As illustrated in FIG. 2, an energy difference equivalent to an energy level difference between the valence band energy level of the well layer 352a and the conduction band energy level of the well layer 352a is light energy El required for light emission. In the laser diode, light is guided in the light emitting unit 35 during resonating. In the nitride semiconductor element 1, in order to confine light in the light emitting unit 35, the refractive index is set to be higher in the light emitting unit 35 than in the second lamination portion 312, the electron blocking layer 34, and the composition change layer 32 which are upper and lower layers of the light emitting unit 35. In a nitride semiconductor, the refractive index becomes lower as the Al composition ratio is higher in the case of AlGaN, for example. Therefore, in the AlGaN laminated structure in the nitride semiconductor element 1, the light emitting unit 35, particularly the lower guide layer 351 guiding light, is formed so that the Al composition ratio is higher than that of the second lamination portion 312, the electron blocking layer 34, and the composition change layer 32. At this time, the energy diagrams are as illustrated in FIG. 2 and injected electron/hole carriers are also confined in the light emitting unit 35 having energy lower than that of the second lamination portion 312, the electron blocking layer 34, and the composition change layer 32 which are the upper and lower layers of the light emitting unit 35. Herein, a part of the composition change layer 32, which is the second composition change region 322 equivalent to a second composition change layer in FIG. 2, is disposed so that the Al composition ratio is lower than that of the lower guide layer 351. When light does not leak to the second composition change region 322 due to the fact that the first composition change region 321 has a sufficient film thickness and a low refractive index, the Al composition ratio can be intentionally reduced for the purpose of injecting a current. In this case, an internal loss described later does not increase. With the internal loss which is one of the factors of increasing the oscillation threshold particularly in a laser diode, the absorption of light in a thin film or a phenomenon in which light leaks to the outside of a waveguide while travelling in the waveguide concerns. In the case of this structure, the light emission is obtained from the well layer 352a configuring the nitride semiconductor active layer 352 which is a light emitting layer. The energy of the light is the light energy El. The absorption of the light into the nitride semiconductor element 1 occurs in a semiconductor layer having band gap energy lower than the light energy El or in a semiconductor layer having the same band gap energy as the light energy El. When the relationship between the light energy El and the band gap energy is as illustrated in FIG. 2, the second nitride semiconductor layer 33 corresponds to a layer absorbing light. More specifically, in the nitride semiconductor element 1, the second nitride semiconductor layer 33 can serve as a light absorption layer.

In general, in the nitride semiconductor, the mobility of electrons is higher than the mobility of holes. Therefore, due to the fact that the Al composition ratio x3 of the composition change layer 32 on the nitride semiconductor active layer 352 side is designed to be higher than an Al composition ratio x1 of the first nitride semiconductor layer 31, the overflowing of electrons to the composition change layer 32 side formed of a p-type semiconductor is prevented. Simultaneously, an Al composition ratio x6 of the electron blocking layer 34 is also designed to be higher than the Al composition ratio x1 of the first nitride semiconductor layer 31. This prevents the overflowing of electrons to the composition change layer 32 side.

The nitride semiconductor element 1 is configured so that the Al composition ratio x3 in an end portion of the first composition change region 321 on the side opposite to the side in which the nitride semiconductor active layer 352 is arranged is higher than an Al composition ratio x4 of the upper guide layer 353. More specifically, the nitride semiconductor element 1 is configured so that the Al composition ratio x3 of the entire first composition change region 321 is higher than the Al composition ratio x4 of the upper guide layer 353. Therefore, the refractive index in the entire layer of the composition change layer 32 is lower than that of the upper guide layer 353. The composition change layer 32 has an effect of confining light emitted in the light emitting unit 35 with the lower guide layer 351 and the upper guide layer 353 to prevent the light from diffusing to the second nitride semiconductor layer 33 containing the absorption layer and the first electrode 14.

Due to the fact that the nitride semiconductor element 1 is provided with the composition change layer 32 having the first composition change region 321 in which the film thickness is adjusted to the optimal value, the nitride semiconductor element 1 achieves both the confinement of light in the light emitting unit 35 and the prevention of the element breakdown even in driving under a high current density.

The nitride semiconductor element 1 is configured so that the Al composition ratio x3 in an end portion of the composition change layer 32 on the side opposite to the side in which the nitride semiconductor active layer 352 is arranged (i.e., end portion of the second composition change region 322 on the side opposite to the side in which the nitride semiconductor active layer 352 is arranged) is higher than an Al composition ratio x5 of the well layers 352a of the nitride semiconductor active layer 352 (lower than the Al composition ratio x4 of the upper guide layer 353). More specifically, the Al composition ratio x3 in the entire region of the second composition change region 322 is configured to be a higher than the Al composition ratio x5 of the well layers 352a (lower than the Al composition ratio x4 of the upper guide layer 353). Therefore, as illustrated in FIG. 2, the band gap energy of the entire second composition change region 322 is higher than the band gap energy of the well layers 352a. More specifically, the band gap energy of the second composition change region 322 is higher than the light energy El of the light emission of the element. Thus, the nitride semiconductor element 1 achieves the suppression of light absorption in the composition change layer 32.

The nitride semiconductor element 1 is configured so that the Al composition ratio x2 of the second nitride semiconductor layer 33 is lower than the Al composition ratio x3 in the end portion of the second composition change region 322 on the side opposite to the side in which the nitride semiconductor active layer 352 is arranged. Therefore, as illustrated in FIG. 2, the valence band energy level of the second nitride semiconductor layer 33 is lower than the conduction band energy level of the end portion of the second composition change region 322 on the side opposite to the side in which the nitride semiconductor active layer 352 is arranged. Thus, in the nitride semiconductor element 1, contact resistance between the second nitride semiconductor layer 33 and the first electrode 14 (refer to FIG. 1) is reduced and a voltage reduction is achieved.

Next, the details of constituent elements configuring the nitride semiconductor element 1 are described using FIG. 3 to FIG. 8 referring to FIG. 1 and FIG. 2.

(Substrate)

Specific examples of materials forming the substrate 11 include Si, SiC, MgO, $Ga_2O_3$, $Al_2O_3$, ZnO, GaN, InN, AlN, or a mixed crystal thereof. The substrate 11 is preferably a thin plate of a square shape in view of the assembling but is not limited thereto. The off angle of the substrate 11 is preferably larger than 0° and smaller than 2° from the viewpoint of growing a high quality crystal. The film thickness of the substrate 11 is not particularly limited in the case of a purpose of laminating an AlGaN layer thereon and is preferably 50 μm or more and 1 mm or less. The substrate 11 is used for the purpose of supporting an upper thin film, improving the crystallinity, and dissipating heat to the outside. Therefore, an AlN substrate containing a material capable of growing AlGaN with high quality and having high thermal conductivity is preferably used. The crystal quality of the substrate 11 is not particularly limited. The threading dislocation density is preferably $1\times10^9$ $cm^{-2}$ or less and more preferably $1\times10^8$ $cm^{-2}$ or less for the purpose of forming a thin film element having high luminous efficiency on the substrate 11. The growth surface of the substrate 11 is preferably commonly-used +c-plane AlN because the cost is low but may be −c-plane AlN, may be a half-polarity surface plate, or may be a nonpolar surface plate. From the viewpoint of enhancing the polarization doping effect, the +c-plane AlN is preferable.

(AlN Layer)

The AlN layer 30 is formed on the entire surface of the substrate 11. In this example, the AlN layer 30 has a thickness of several μm (for example, 1.6 μm) but the thickness is not limited to this value. Specifically, the film thickness of the AlN layer 30 is preferably larger than 10 nm and smaller than 10 μm. Due to the fact that the film thickness of the AlN layer 30 is larger than 10 nm, AlN having high crystallinity can be produced. Due to the fact that the film thickness of the AlN layer 30 is smaller than 10 μm, the crystal growth free from cracks can be achieved on the entire wafer surface. The AlN layer 30 more preferably has a film thickness larger than 50 nm and smaller than 5 μm. Due to the fact that the film thickness of the AlN layer 30 is larger than 50 nm, AlN with high crystallinity can be produced with good reproducibility. Due to the fact that the film thickness of the AlN layer 30 is smaller than 5 μm, the crystal growth having low cracks occurrence probability can be achieved. When AlN is used as the formation material of the substrate 11, the same material is used for the AlN layer 30 and the substrate 11, and therefore the boundary between the AlN layer 30 and the substrate 11 is indefinite. In this embodiment, when the substrate 11 is made of AlN, it is regarded that the nitride semiconductor element 1 has an AlN layer even when the AlN layer is not laminated on the substrate 11. The AlN layer 30 is formed to be smaller than the first nitride semiconductor layer 31 but the present invention is not limited thereto. When the first nitride semiconductor layer 31 is thicker than the AlN layer 30, the film thickness of the first nitride semiconductor layer 31 can be increased as much as possible within the range where a crack is suppressed. Therefore, the resistance in the horizontal direction of a thin film laminate of the first nitride semiconductor layer 31 is reduced, and thus the nitride semiconductor element 1 driven at a low voltage can be realized. When the driving at a low voltage of the nitride semiconductor element 1 is realized, the breakdown under driving at a high current density by the heat generation can be further suppressed. The AlN layer 30 has a small lattice constant difference and a small thermal expansion coefficient difference from the first nitride semiconductor layers 31, so that a nitride semiconductor layer with few defects can be grown on the AlN layer 30. Furthermore, the AlN layer 30 can grow the first nitride semiconductor layer 31 under a compression stress and can suppress the occurrence of cracks in the first nitride semiconductor layer 31. When the substrate 11 is made of nitride semiconductors of GaN, AlN, AlGaN, and the like, a nitride semiconductor layer with few defects can be grown on the substrate 11 for the reason described above. Therefore, when the substrate 11 is made of nitride semiconductors of GaN, AlN, AlGaN, and the like, the AlN layer 30 may not be provided. Also on the other substrates, high quality AlGaN may be directly formed on the substrates and AlN may not be provided. Impurities, such as carbon, silicon, iron, and magnesium, may be mixed into the AlN layer 30.

(First Nitride Semiconductor Layer)

Examples of materials forming the first lamination portion 311 configuring the first nitride semiconductor layer 31 include $Al_{x1}Ga_{(1-x1)}N$ (0<x1<1). The Al composition ratio of the first nitride semiconductor layer can be specified by the energy dispersive X-ray analysis (EDX) of the cross-sectional structure. With respect to the cross section, the cross section along the a-plane of AlGaN is exposed using a focused ion beam (FIB) device. As a method for observing the cross section, a transmission electron microscope is used. The observation magnification is set to ×1000 times/nm to the film thickness of the layer to be measured. For example, in order to observe a layer having a 100 nm film thickness, the layer is observed at a magnification of 100000 times. In order to observe a layer having a 1 μm film thickness, the layer is observed at a magnification of 1000000 times. The Al composition ratio can be defined as the ratio of the number of moles of Al to the sum of the number of moles of Al and Ga and can be defined, and the Al composition ratio can be specifically defined by using values of the number of moles of Al, Ga analyzed and quantified from the EDX. $Al_{x1}Ga_{(1-x1)}N$ forming the first lamination portion 311 may contain impurities, such as Group V elements other than N, such as P, As, or Sb, C, H, F, O, Mg, or Si. Due to the fact that the first lamination portion 311 is made of $Al_{x1}Ga_{(1-x1)}N$, a region where the second lamination portion 312 is not formed is made of AlGaN on the upper surface 311a of the first lamination portion 311. The first lamination portion 311 may contain B and in other than Al, Ga as Group III elements. However, the occurrence of a defect and a change in durability occur in a portion containing B and In, and therefore it is preferable that Group III elements other than Al, Ga are not contained. In this embodiment, the first lamination portion 311 is an n-type semiconductor, for example. When the first lamination portion 311 is formed into an n-type semiconductor, the first lamination portion 311 is formed into an n-type by doping (for example, $1×10^{19}$ cm$^{-3}$) the same with Si, for example. When the first lamination portion 311 is formed into a p-type semiconductor, the first lamination portion 311 is formed into a p-type by doping (for example, $3×10^{19}$ cm$^{-3}$) the same with Mg, for example. The first lamination portion 311 and the second electrode 15 may directly contact each other or may be connected through a different layer, such as tunnel junction. When the tunnel junction is formed between the first nitride semiconductor layer 31 containing an n-type semiconductor and the second electrode 15, a p-type semiconductor is present between the first nitride semiconductor layer 31 and the second electrode 15. Therefore, the second electrode 15 can form ohmic junction with the p-type semiconductor, and thus is preferably a laminated electrode or an alloyed metal of Ni and Au, for example.

Herein, the composition change layer 32 described later contains AlGaN in which Al decreases, and therefore when +c-plane sapphire is used as a substrate, for example, the composition change layer 32 becomes a p-type semiconductor by polarization. When −c-plane sapphire is used, the composition change layer 32 becomes an n-type semiconductor by polarization. From the viewpoint of producing a PN diode, the second lamination portion 312 is an n-type semiconductor when +c-plane sapphire is used and is a p-type semiconductor when −c-plane sapphire is used.

The second lamination portion 312 configuring the first nitride semiconductor layer 31 is formed on the first lamination portion 311 and formed in a part of the first lamination portion 311. The second lamination portion 312 may be formed on the entire surface of the upper surface 311a of the first lamination portion 311. The second lamination portion 312 may have conductivity in order to supply electrons or holes to the light emitting unit 35. The thickness of the second lamination portion 312 is not particularly limited. For example, in order to reduce the resistance of the second lamination portion 312, the thickness may be 100 nm or more. From the viewpoint of suppressing the occurrence of cracks in the formation of the second lamination portion 312, the thickness may be 10 μm or less.

Examples of materials forming the second lamination portion 312 include $Al_{x1}Ga_{(1-x1)}N$ (0≤x1≤1). The Al composition ratio x1 of $Al_xGa_{(1-x1)}N$ forming the second lamination portion 312 may be the same as the Al composition ratio x1 of $Al_{x1}Ga_{(1-x1)}$ N of the upper surface 311a of the first lamination portion 311 or may be lower than the Al composition ratio x1 of $Al_{x1}Ga_{(1-x1)}N$ of the upper surface 311a. This enables the suppression of the occurrence of defects in the lamination interface between the first lamination portion 311 and the second lamination portion 312. The materials forming the second lamination portion 312 may contain impurities, such as Group V elements other than N, such as P, As, or Sb, Group III elements, such as In or B, C, H, F, O, Si, Cd, Zn, or Be.

In this embodiment, the second lamination portion 312 is an n-type semiconductor, for example. When the second lamination portion 312 is an n-type semiconductor, the second lamination portion 312 can be formed into an n-type by doping the same with Si by $1×10^{19}$ cm$^{-3}$, for example. When the second lamination portion 312 is a p-type semiconductor, the second lamination portion 312 can be formed into a p-type by doping the same with Mg by $3×10^{19}$ cm$^{-3}$, for example. The impurity concentration may be uniform or nonuniform in the entire layer. Alternatively, the impurity concentration may be nonuniform only in the film thickness direction or may be nonuniform only in the horizontal direction to the substrate.

Figure 3:
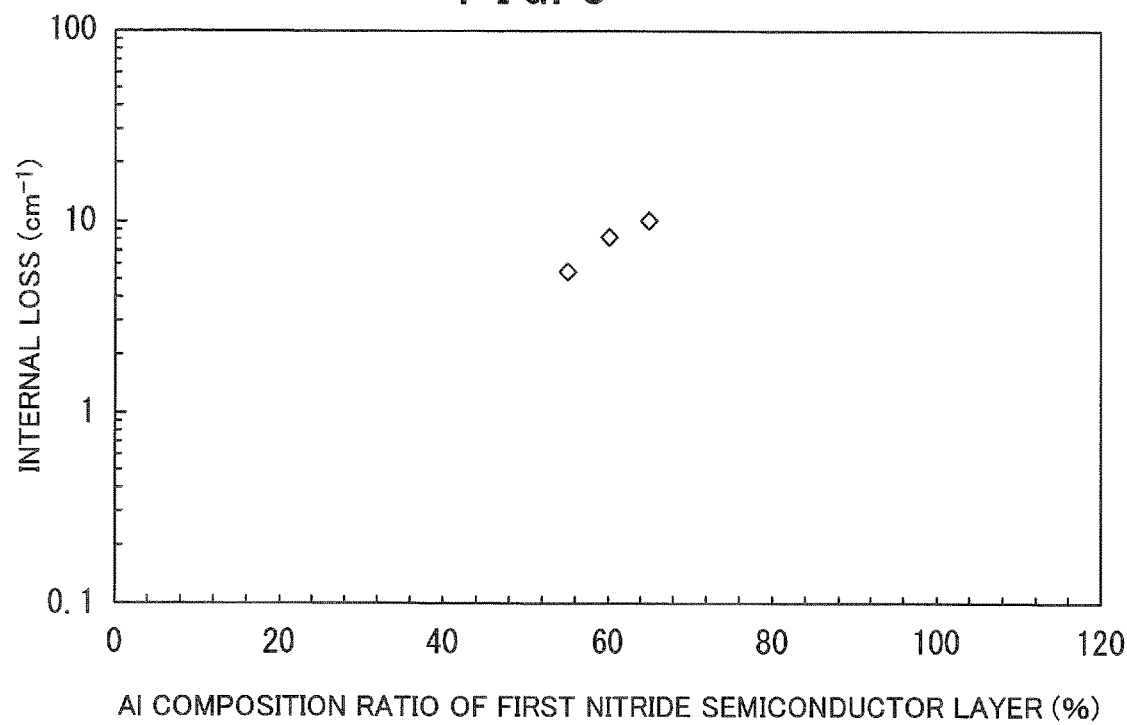
FIG. 3 is a graph illustrating an example of an internal loss to the Al composition ratio of a first nitride semiconductor layer provided in the nitride semiconductor element according to the first embodiment of the present invention.

Herein, the Al composition ratio x1 and the film thickness of the first nitride semiconductor layer 31 are described using FIG. 3. FIG. 3 is a graph illustrating an example of an internal loss to the Al composition ratio x1 of the first nitride semiconductor layer 31 provided in the nitride semiconductor element 1. In FIG. 3, the horizontal axis represents the Al composition ratio x1(%) of the first nitride semiconductor layer 31 and the vertical axis represents the internal loss (cm$^{-1}$).

Table 1 illustrates the basic model of a current and light emission simulation of the nitride semiconductor element 1 for obtaining graphs illustrated in FIG. 3 and FIG. 4 to FIG. 8 described later. In this simulation, a laser diode is assumed as the nitride semiconductor element 1. "Layer name" illustrated in the first column of Table 1 illustrates each layer configuring the nitride semiconductor element 1. "Al composition ratio (%)" illustrated in the first column of Table 1 illustrates the Al composition ratio of AlGaN forming each layer indicated in the "Layer name" column by percentage. "Film thickness (nm)" illustrated in the first column of Table 1 illustrates the film thickness (The unit is nanometer (nm).) of each layer indicated in the "Layer name" column. "Doping (cm$^{-3}$)" illustrated in the first column of Table 1 illustrates the type and the concentration of the impurities injected into each layer indicated in the "layer name" column. In the "Doping (cm$^{-3}$)" column corresponding to a layer into which no impurities are injected, "–" is indicated. "Electron mobility (cm$^2$/Vs)" illustrated in the first column of Table 1 illustrates the electron mobility in each layer indicated in the "Layer name" column. "Hole mobility (cm$^2$/Vs)" illustrated in the first column of Table 1 illustrates the hole mobility in each layer indicated in the "Layer name" column. "50→0" indicated in a portion corresponding to the second composition change region 322 of the "Al composition ratio (%)" column of Table 1 illustrates that the Al composition ratio of the second composition change region 322 changes from 50% to 0% from an end portion on the first composition change region 321 side toward an end portion on the second nitride semiconductor layer 33 side. "80→50" indicated in a portion corresponding to the first composition change region 321 of the "Al composition ratio (%)" column of Table 1 illustrates that the Al composition ratio of the first composition change region 321 changes from 80% to 50% from an end portion on the electron blocking layer 34 side toward an end portion on the second composition change region 322 side. For the simulation, SiLENSe LD Edition of STR Corporation was used.

TABLE 1

| Layer name | Al composition ratio (%) | Film thickness (nm) | Doping (cm$^{-3}$) | Electron mobility (cm$^2$/Vs) | Hole mobility (cm$^2$/Vs) |
|---|---|---|---|---|---|
| Second nitride semiconductor layer | 0 | 10 | Acceptor: $3 \times 10^{19}$ | 50 | 3.9 |
| Second composition change region | 50 → 0 | 100 | Acceptor: $3 \times 10^{19}$ | 50 | 5.5 |
| First composition change region | 80 → 50 | 230 | Acceptor: $3 \times 10^{19}$ | 50 | 5.5 |
| Electron block layer | 80 | 30 | — | 50 | 5 |
| Upper guide layer | 50 | 150 | — | 50 | 5 |
| Active layer (Barrier layer/Well layer) | 50/35 | 8/4 | — | 50 | 5 |
| Lower guide layer | 50 | 150 | — | 50 | 5 |
| First nitride semiconductor layer | 60 | 1000 | Donor: $1 \times 10^{19}$ | 57 | 5 |

In order to obtain the graphs illustrated in FIG. 3 and FIG. 4 to FIG. 8 described later, the following parameters are set as a laser simulation model in addition to the basic model of the current simulation illustrated in Table 1. The resonator width of the nitride semiconductor element 1, i.e., the width of the ridge portion semiconductor layer 17, is set to 3 μm. The resonator length of the nitride semiconductor element 1, i.e., length between the resonator surface 16a and the rear resonator surface 16b, is set to 500 μm. Furthermore, the reflectance of each of the resonator surface 16a and the rear resonator surface 16b is set to 18%.

When the internal loss in the resonator (i.e., light emitting unit 35) is set as αi, the length of the resonator (i.e., distance between the resonator surface 16a and the rear resonator surface 16b) is set as L, the reflectance of the resonator surface 16a on the light extraction side is set as Rf, the reflectance of the rear resonator surface 16b which is not the light extraction side is set as Rr, the mirror loss is set as αm, and the oscillation threshold gain is set as gth, the mirror loss can be expressed by the following expression (1) and the oscillation threshold gain can be expressed by the following expression (2).

[Expression 1]
$$\alpha_m = \frac{1}{2L} \ln \frac{1}{R_f R_r} \quad (1)$$

[Expression 2]
$$g_{th} = \alpha_i + \frac{1}{2L} \ln \frac{1}{R_f R_r} \quad (2)$$

As illustrated in Expression (2), the nitride semiconductor element 1 can achieve a reduction in the oscillation threshold gain gth due to a reduction in the internal loss αi and the mirror loss αm. The nitride semiconductor element 1 achieves oscillation due to the fact that a gain g exceeds the optical loss which is the sum of the internal loss αi and the mirror loss αm. The gain g resulting in the oscillation is the oscillation threshold gain gth. The oscillation current density threshold (hereinafter sometimes referred to as "threshold current density") Jth is also affected by, in addition to the oscillation threshold gain gth, the internal efficiency indicating the efficiency that carriers injected into the nitride semiconductor element 1 from an external power supply are energy-converted into photons, the light confinement coefficient indicated by the overlapping ratio with the well layer 352a in a light intensity distribution in the vertical direction to the substrate in the nitride semiconductor element 1, and the film thickness of the nitride semiconductor active layer 352. However, it is confirmed in Examples described later that the internal efficiency and the light confinement coefficient of the nitride semiconductor element 1 are constant. Similarly, it is confirmed in Examples described later that the mirror loss αm is constant at 34.3 cm$^{-1}$. As the film thickness of the active layer, the same film thickness is used in all the designs in Examples described later. More specifically, for the threshold current density Jth for the oscillation, the internal loss αi serves as a control factor. It can be said that an element having a lower internal loss αi has a lower threshold current density Jth and is a preferable element in Examples described later.

As illustrated in FIG. 3, the internal loss αi becomes higher as the Al composition ratio x1 of the first nitride semiconductor layer 31 becomes higher. In the simulation, the laser oscillation was not able to be confirmed in a region where the Al composition ratio is less than 50% of the first nitride semiconductor layer 31 and no current flows in a region where the Al composition ratio is 80% or more of the first nitride semiconductor layer 31 and laser oscillation was not able to be confirmed.

In the simulation of the nitride semiconductor element 1, when the Al composition ratio x1 of the first nitride semiconductor layer 31 is higher by 0.05 or more and less than 0.3 than the Al composition ratio x3 in the end portion of the first composition change region 321 on the side opposite to the side in which the nitride semiconductor active layer 352 is arranged, the oscillation of the nitride semiconductor element 1 was confirmed. Therefore, the first nitride semiconductor layer 31 may be formed so that the Al composition ratio is higher than that in the end portion of the first composition change region 321 on the side opposite to the side in which the nitride semiconductor active layer 352 is arranged, for example. More specifically, the Al composition ratio x1 of the first nitride semiconductor layer 31 may be higher than the Al composition ratio x3 in the end portion on the second composition change region 322 side of both end portions of the first composition change region 321. The Al composition ratio x1 of the first nitride semiconductor layer 31 is more preferably 0.05 or more and 0.1 or less. Due to the fact that the Al composition ratio x1 of the first nitride semiconductor layer 31 is within this range, particularly the oscillation threshold can be reduced and further a necessity of increasing the Al composition ratio of the first nitride semiconductor layer 31 more than necessary is eliminated. Thus, the contact resistance between the first nitride semiconductor layer 31 and the first electrode 14 and the resistance of the semiconductor of the first nitride semiconductor layer 31 can be reduced, and therefore the driving voltage of the nitride semiconductor element 1 can be reduced. By reducing the driving voltage of the nitride semiconductor element 1, the heat generation amount can be suppressed, a high current density can be realized, and a high output light emitting element or a laser diode with a low threshold can be realized.

Due to the fact that the Al composition ratio x1 of $Al_{x1}Ga_{(1-x1)}N$ which is the formation material of the first nitride semiconductor layer 31 is higher than 0.2, a composition difference can be given between the first nitride semiconductor layer 31 and the lower guide layer 351. In addition thereto, it is easy to give a composition difference between the lower guide layer 351 and the second nitride semiconductor layer 33. As described above, the Al composition of the lower guide layer 351 is required to be made smaller than that of the second lamination portion 312 of the first nitride semiconductor layer 31, and therefore it is indispensable to form the composition difference with good controllability in a manufacturing process from the viewpoint of confining light.

The Al composition ratio x1 of $Al_{x1}Ga_{(1-x1)}N$ which is the formation material of the first nitride semiconductor layer 31 may be lower than 1. Even when substrates of different species of SiC, sapphire, ZnO, and the like are commonly used or even when an AlN substrate is used, it is particularly common in a ultraviolet light receiving/emitting element to laminate, on these substrates, AlN in pseudo lattice matching with a Group III nitride semiconductor to be laminated on the substrates. Therefore, a lattice constant difference between the AlN laminated on the substrate and the first nitride semiconductor layer 31 is small and high quality crystal growth can be achieved.

(Lower Guide Layer)

The lower guide layer 351 is formed on the second lamination portion 312 of the first nitride semiconductor layer 31. In order to confine light emitted in the nitride semiconductor active layer 352 in the light emitting unit 35, a refractive index difference from the second lamination portion 312 is given to the lower guide layer 351. Examples of materials forming the lower guide layer 351 include a mixed crystal of AlN, GaN. A specific example of the materials forming the lower guide layer 351 is $Al_{x4}Ga_{(1-x4)}N$ ($0<x4<1$). The Al composition ratio of the lower guide layer 351 can be specified by the energy dispersive X-ray analysis (EDX) of the cross-sectional structure. The Al composition ratio can be defined as the ratio of the number of moles of Al to the sum of the number of moles of Al and Ga and can be defined, and the Al composition ratio can be specifically defined by using values of the number of moles of Al, Ga analyzed and quantified from the EDX. The Al composition ratio x4 of $Al_{x4}Ga_{(1-x4)}N$ forming the lower guide layer 351 may be lower than the Al composition ratio x1 of $Al_{x1}Ga_{(1-x1)}N$ forming the second lamination portion 312. Thus, the refractive index is larger in the lower guide layer 351 than in the second lamination portion 312, and thus light emitted in the nitride semiconductor active layer 352 can be confined in the light emitting unit 35. The materials forming the lower guide layer 351 may contain impurities, such as Group V elements other than N, such as P, As, or Sb, Group III elements, such as In or B, C, H, F, O, Si, Cd, Zn, or Be.

When the lower guide layer 351 is an n-type semiconductor, the lower guide layer 351 can be formed into an n-type by doping the same with Si by $1\times10^{19}$ cm$^{-3}$, for example. When the lower guide layer 351 is a p-type semiconductor, the lower guide layer 351 can be formed into a p-type by doping the same with Mg by $3\times10^{19}$ cm$^{-3}$, for example. The lower guide layer 351 may have a dopant only in a part in the film thickness direction. More specifically, in the part in the film thickness direction of the lower guide layer 351, an n-type semiconductor and an undoped layer or a p-type semiconductor and an undoped layer may be combined. The lower guide layer 351 may be an undoped layer. The lower guide layer 351 may have a structure in which the composition is graded. For example, the lower guide layer 351 may have a layer structure in which the Al composition ratio x4 of $Al_{x4}Ga_{(1-x4)}N$ is continuously or stepwisely changed from 0.6 to 0.5. The thickness of the lower guide layer 351 is not particularly limited. The thickness of the lower guide layer 351 may be 10 nm or more in order to efficiently confine light emitted from the nitride semiconductor active layer 352 in the light emitting unit 35. The thickness of the lower guide layer 351 may be 2 μm or less from the viewpoint of reducing the resistance of the lower guide layer 351. The lower guide layer 351 may have an AlGaN layer serving as a blocking layer within a range where the purpose of confining light in the light emitting unit 35 is held. This aims at blocking carriers as with the electron blocking layer 34 described later.

(Nitride Semiconductor Active Layer)

The nitride semiconductor active layer 352 is a layer from which light emission is obtained of the nitride semiconductor element 1. More specifically, the nitride semiconductor active layer 352 is a light emitting layer. Examples of materials forming the nitride semiconductor active layer 352 include AlN, GaN, and a mixed crystal thereof. A specific example of the materials forming the nitride semiconductor active layer 352 is $Al_xGa_{(1-x)}N$ ($0 \le x \le 1$). The Al composition ratio x of $Al_xGa_{(1-x)}N$ of the nitride semiconductor active layer 352 may be lower than the Al composition ratio x4 of $Al_{x4}Ga_{(1-x4)}N$ of the lower guide layer 351 in order to efficiently confine carriers injected from the first electrode 14 and the second electrode 15 in the light emitting unit 35. For example, the nitride semiconductor active layer 352 may be made of $Al_xGa_{(1-x)}N$ in which an Al composition ratio x satisfies the relationship of $0.2 \le x < 1$. The materials forming the nitride semiconductor active layer 352 may contain impurities, such as Group V elements other than N, such as P, As, or Sb, Group III elements, such as In or B, C, H, F, O, Si, Cd, Zn, or Be.

When the nitride semiconductor active layer 352 is an n-type semiconductor, the nitride semiconductor active layer 352 can be formed into an n-type by doping the same with Si by $1 \times 10^{19}$ cm$^{-3}$, for example. When the nitride semiconductor active layer 352 is a p-type semiconductor, the nitride semiconductor active layer 352 can be formed into a p-type by doping the same with Mg $3 \times 10^{19}$ cm$^{-3}$, for example. The nitride semiconductor active layer 352 may be an undoped layer.

The nitride semiconductor active layer 352 may have a multiple quantum well (MQW) structure in which the well layer 352a (see FIG. 2) formed of $Al_{x5}Ga_{(1-x5)}N$, for example, and the barrier layer 352b (see FIG. 2) provided adjacent to the well layer 352a and formed of $Al_{x4}Ga_{(1-x4N)}$, for example, are provided and the well layers 352a (see FIG. 2) and the barrier layers 352b are alternately laminated one by one. The Al composition ratio x5 of the well layer 352a is lower than the Al composition ratio x4 of each of the lower guide layer 351 and the upper guide layer 353. The Al composition ratio x5 of the well layer 352a is lower than the Al composition ratio x4 of the barrier layer 352b. In this embodiment, the Al composition ratio x4 of the barrier layer 352b is the same as the Al composition ratio x4 of each of the lower guide layer 351 and the upper guide layer 353 but may be higher or lower than the Al composition ratio x4 of each of the lower guide layer 351 and the upper guide layer 353. The average Al composition ratio of the well layers 352a and the barrier layers 352b is the Al composition ratio x of the nitride semiconductor active layer 352. Due to the fact that the nitride semiconductor element 1 has the nitride semiconductor active layer 352 of the multi quantum well structure, an improvement of the luminous efficiency and the luminous intensity of the nitride semiconductor active layer 352 can be achieved. The Al composition ratios of the well layer 352a and the barrier layer 352b can be specified by the energy dispersive X-ray analysis (EDX) of the cross-sectional structure. The Al composition ratio can be defined as the ratio of the number of moles of Al to the sum of the number of moles of Al and Ga and can be defined, and the Al composition ratio can be specifically defined by using values of the number of moles Al, Ga analyzed and quantified from the EDX. The nitride semiconductor active layer 352 may have a double quantum well structure of "Barrier layer/Well layer/Barrier layer/Well layer/Barrier layer", for example. The film thickness of each of the well layers may be 4 nm, the film thickness of each of the barrier layers may be 8 nm, and the film thickness of the nitride semiconductor active layer 352 may be 32 nm. The number of the quantum wells of the multiple quantum well layer may be one layer (i.e., not a multiple quantum well but a single quantum well) or may be two layers, three layers, four layers, or five layers. A single well layer is preferable from the purpose of increasing the carrier density in one well layer.

When the Al composition ratio x5 of $Al_{x5}Ga_{(1-x5)})$ N of the formation material of the well layer 352a configuring the nitride semiconductor active layer 352 is set to satisfy the relationship of $0.2 \leq x5 \leq 1$, the effects of the present invention described above are high. When the Al composition ratio x5 of the well layer 352a is lower than 0.2, the maximum value of the Al composition ratios x2 of the first nitride semiconductor layer 31, the composition change layer 32, and the second nitride semiconductor layer 33 preferably takes a value as small as possible which is 0.2 or more from the viewpoint of increasing the luminous efficiency of the nitride semiconductor element 1 and from the viewpoint of reducing the driving voltage. This is because, when the Al composition ratio of each layer of the nitride semiconductor element 1 increases, a driving voltage required for the driving of a diode theoretically increases and the contact resistance between the first nitride semiconductor layer 31 and the second electrode 15 and the contact resistance between the second nitride semiconductor layer 33 and the first electrode 14 increase, so that the driving voltage increases. When the driving voltage of the nitride semiconductor element 1 increases, the heat generation amount increases, so that the element breakdown under a high current density is likely to occur. Therefore, the increase in the driving voltage is not preferable. However, when the Al composition is small, an Al composition difference between the first composition change region 321 and the second composition change region 322 becomes small, which is disadvantageous from the viewpoint of generating a hole gas which is more easily generated as the Al composition difference is larger. When the Al composition ratio x of $Al_xGa_{(1-x)}N$ of the formation material of the nitride semiconductor active layer 352 is 1, the nitride semiconductor active layer 352 cannot be formed to have the well structure with AlGaN. Therefore, it is difficult to confine carriers and light, so that the luminous efficiency is low in a light emitting diode (LED) and laser oscillation cannot be realized in a semiconductor laser (LD). The nitride semiconductor element 1 is provided with the AlN layer 30, and therefore, when the Al composition ratio x3 of the first composition change region 321 is lower than 0.2, it is preferable that the growth is caused to occur on a growth condition of causing three-dimensional growth due to the internal stress during the growth of a layer under the nitride semiconductor active layer 352 in order to avoid lattice relaxation in the nitride semiconductor active layer 352. When not using the growth condition of causing the three-dimensional growth, the relaxation occurs during the growth of the nitride semiconductor active layer 352, and a defect of blocking light emission, such as misfit transposition, increases, and therefore the luminous efficiency is likely to decrease. Due to the fact that the nitride semiconductor active layer 352 is formed of $Al_{x5}Ga_{(1-5x)}N$ in which the Al composition ratio x5 of the well layer 352a satisfies the relationship of $0.2 \leq x5 \leq 1$, the relaxation occurs in the layer under the nitride semiconductor active layer 352, a reduction in the luminous efficiency can be suppressed by suppressing the lattice relaxation in the nitride semiconductor active layer 352, and carriers are easily transported to the nitride semiconductor active layer 352 by setting the Al composition ratio x5 of the formation material of the well layer 352a to be lower than 1, and therefore a reduction in the luminous efficiency is suppressed.

(Upper Guide Layer)

The upper guide layer 353 is formed on the nitride semiconductor active layer 352. In order to confine light emitted in the nitride semiconductor active layer 352 in the light emitting unit 35, a refractive index difference from the second nitride semiconductor layer 33 is given to the upper guide layer 353. Examples of materials forming the upper guide layer 353 include AlN, GaN, and a mixed crystal thereof. A specific example of the materials forming the upper guide layer 353 is $Al_{x4}Ga_{(1-x4)}N$ ($0 \leq x4 \leq 1$). The Al composition ratio of the upper guide layer 353 can be specified by the energy dispersive X-ray analysis (EDX) of the cross-sectional structure. The Al composition ratio can be defined as the ratio of the number of moles of Al to the sum of the number of moles of Al and Ga and can be defined, and the Al composition ratio can be specifically defined by using values of the number of moles Al, Ga analyzed and quantified from the EDX. The Al composition ratio x4 of $Al_{x4}Ga_{(1-x4)}N$ of the upper guide layer 353 may be higher than the Al composition ratio x5 of $Al_{x5}Ga_{(1-x5)})N$ of the well layer 352a. Thus, carriers can be confined in the nitride semiconductor active layer 352. The materials forming the upper guide layer 353 may contain impurities, such as Group V elements other than N, such as P, As, or Sb, Group III elements, such as In or B, C, H, F, O, Si, Cd, Zn, or Be.

When the upper guide layer 353 is an n-type semiconductor, the upper guide layer 353 can be formed into an n-type by doping the same with Si by $1\times10^{19}$ cm$^{-3}$, for example. When the upper guide layer 353 is a p-type semiconductor, the upper guide layer 353 can be formed into a p-type by doping the same with Mg by $3\times10^{19}$ cm$^{-3}$, for example. The upper guide layer 353 may be an undoped layer. The upper guide layer 353 may have a structure in which the Al composition ratio x4 of $Al_{x4}Ga_{(1-x4)}N$ is graded. For example, the upper guide layer 353 may have a layer structure in which the Al composition ratio x4 of $Al_{x4}Ga_{(1-x4)}N$ is continuously or stepwisely changed from 0.5 to 0.6. The thickness of the upper guide layer 353 is not particularly limited. The thickness of the upper guide layer 353 may be 10 nm or more in order to efficiently confine light emitted from the nitride semiconductor active layer 352 in the light emitting unit 35. The thickness of the upper guide layer 353 may be 2 µm or less from the viewpoint of reducing the resistance of the upper guide layer 353. The Al composition ratios x4 of $Al_{x4}Ga_{(1-x4)}N$ ($0 \leq x4 \leq 1$) of the upper guide layer 353 and the lower guide layer 351 may be the same value or may be different values.

(Electron Blocking Layer)

The electron blocking layer 34 is made of $Al_{x6}Ga_{(1-x6)}N$, for example. The electron blocking layer 34 is preferably a p-type semiconductor when the second lamination portion 312 is an n-type semiconductor and the composition change layer 32 is a p-type semiconductor and it is preferable that Mg is injected thereinto. Mg is injected into the electron blocking layer 34 with an impurity concentration of $1\times10^{18}$ cm$^{-3}$, for example. Thus, the electron blocking layer 34 is formed into a p-type to be configured into a p-type semiconductor. To the electron blocking layer 34, Mg may not be added. Due to the fact that Mg is not added to the electron blocking layer 34, the conductivity of the electron blocking layer 34 decreases but an increase in the internal loss due to absorption can be suppressed particularly in a laser diode. Therefore, the threshold current density Jth can be reduced. In the nitride semiconductor element 1, when the hole concentration in the composition change layer 32 is low, there is a possibility that all electrons flowing from the first nitride semiconductor layer 31 side are not injected into the nitride semiconductor active layer 352 and some electrons flow to the composition change layer 32 side. Thus, in the nitride semiconductor element 1, the electron injection efficiency decreases, and therefore there is a possibility that it becomes difficult to sufficiently improve the luminous efficiency. Hence, in this embodiment, the electron blocking layer 34 is provided between the light emitting unit 35 and the composition change layer 32. The electron blocking layer 34 can reflect the electrons which are caused to flow from the first nitride semiconductor layer 31 side and are not injected into the nitride semiconductor active layer 352, and then inject the electrons into the nitride semiconductor active layer 352. Thus, the electron injection efficiency increases, and therefore the nitride semiconductor element 1 can achieve an improvement of the luminous efficiency.

The electron blocking layer 34 is required to have a barrier height as high as possible from the viewpoint of blocking electrons. However, when the barrier height is excessively made high, the element resistance increases, which causes an increase in the driving voltage of the nitride semiconductor element 1 and a reduction in the maximum current density which can be reached in a range where the nitride semiconductor element 1 is not broken. Therefore, the barrier height of the electron blocking layer 34 has the optimal point. As a preferable range of the Al composition ratio x6 of the electron blocking layer 34, the Al composition ratio is higher by 0.3 or more and less than 0.55 than the Al composition ratio x4 of the nitride semiconductor active layer 352. When the composition difference in the relevant place is 0.55, an increase in the element resistance is observed. When the composition difference is less than 0.3, a phenomenon in which the element is insulated is observed. As a reason why the element is insulated when the composition difference is less than 0.3, it is assumed that a two-dimensional electron gas generated due to the Al composition difference between the lower guide layer 351 and the electron blocking layer 34 and a three-dimensional hole gas generated in the first composition change region 321 are mutually diffused through the electron blocking layer 34, and, as a result, carrier disappearance is caused, so that a depletion layer is formed in the periphery of the electron blocking layer 34. This is considered to be because when the composition difference between the nitride semiconductor active layer 352 and the electron blocking layer 34 is smaller than 0.3, an electron gas generated particularly on the lower guide layer 351 side is likely to be diffused to the composition change layer 32 side. The Al composition ratio x6 of the electron blocking layer 34 is preferably lower than 1 from the viewpoint of suppressing the occurrence of cracks.

In this embodiment, the Al composition ratio x6 of $Al_{x6}Ga_{(1-x6)}N$ forming the electron blocking layer 34 is set to the same value as the maximum value of the Al composition ratio x3 of $Al_{x3}Ga_{(1-x3)}N$ forming the composition change layer 32. The Al composition ratio of the electron blocking layer 34 can be specified by the energy dispersive X-ray analysis (EDX) of the cross-sectional structure. The Al composition ratio can be defined as the ratio of the number of moles of Al to the sum of the number of moles of Al and Ga and can be defined, the Al composition ratio can be specifically defined by using values of the number of moles Al, Ga analyzed and quantified from the EDX. The electron blocking layer 34 is disposed between the nitride semiconductor active layer 352 and the upper guide layer 353 in some cases. The electron blocking layer 34 is disposed in the lower guide layer 351 so as to divide the lower guide layer 351. The electron blocking layer 34 is also disposed between the lower guide layer 351 and the nitride semiconductor active layer 352 in some cases. Two or more of the electron blocking layers 34 are disposed at the arrangement places in some cases. The electron blocking layer 34 may be formed of a single Al composition or may have a superlattice structure in which the Al compositions of a high composition and a low composition are repeated. The thickness of the electron blocking layer 34 is 0 nm, i.e., the electron blocking layer 34 may not be provided. The film thickness range of the electron blocking layer 34 is preferably 0 nm or more and 50 nm or less. When the film thickness of the electron blocking layer 34 is 50 nm or less, the element resistance is low and a low driving voltage is achieved. The film thicknesses of the electron blocking layer 34 is more preferably 0 nm or more and 30 nm or less and still more preferably 2 nm or more and 20 nm or less. The element resistance can be further reduced as the film thickness of the electron blocking layer 34 is smaller, and therefore an increase in the driving voltage of the nitride semiconductor element 1 can be suppressed. However, when the film thickness of the electron blocking layer 34 is larger than 2 nm, the electron blocking effect is exhibited and the internal efficiency can be improved, and therefore the thickness is preferable from the viewpoint of an improvement of the light emission output.

(Composition Change Layer)

A part of the composition change layer 32 configures a part of the ridge portion semiconductor layer 17. More specifically, the projection portion 321a formed in the first composition change region 321 and the second composition change region 322 of the composition change layer 32 configure a part of the ridge portion semiconductor layer 17. In this embodiment, the projection portion 321a is disposed at a place as close as possible to the second electrode 15 in the first composition change regions 321. More specifically, the ridge portion semiconductor layer 17 is disposed to be closer to the second electrode 15 side. Due to the fact that the ridge portion semiconductor layer 17 is close to the second electrode 15, a path where a current flows in the nitride semiconductor element 1 becomes short, and therefore the resistance value of a current path formed in the nitride semiconductor element 1 can be reduced. Thus, the driving voltage of the nitride semiconductor element 1 can be reduced. However, the projection portion 321a and the ridge portion semiconductor layer 17 are preferably separated by 1 μm or more from the mesa end from the viewpoint of the reproducibility of lithography. The projection portion 321a and the ridge portion semiconductor layer 17 may be formed to be closer to the side disposed in the center.

Herein, the first composition change region 321 configuring the composition change layer 32 is described. AlGaN configuring the first composition change region 321 may contain impurities, such as Group V elements other than N, such as P, As, or Sb, Group III elements, such as In or B, C, H, F, O, Si, Cd, Zn, or Be. AlGaN configuring the first composition change region 321 may contain Si as an n-type semiconductor dopant and Mg as a p-type semiconductor dopant. The first composition change region 321 is a region where the Al composition ratio continuously decreases and holes are generated by polarization in the +c-plane growth. In this case, the first composition change region 321 may contain Mg as a dopant. In the −c-plane growth, electrons are generated by polarization. In this case, the first composition change region 321 may contain Si as a dopant. The first composition change region 321 may be an undoped layer not containing Si and Mg as a dopant. By forming the first composition change region 321 into an undoped layer, the absorption of light due to impurities can be suppressed and the internal loss can be reduced in a laser diode. Also in a light emitting diode, the light extraction efficiency is improved by suppressing the light absorption, so that the luminous efficiency can be improved. The Al composition ratio on the electron blocking layer 34 side of AlGaN of the first composition change region 321 may be the same as, higher than, or lower than the Al composition ratio of the electron blocking layer 34. When the Al composition ratio on the electron blocking layer 34 side of AlGaN of the first composition change region 321 and the Al composition ratio of the electron blocking layer 34 are the same, an element in which the diode rising voltage is the lowest can be produced from the viewpoint of suppressing the barrier between the layers, and therefore the element is suitable for an element with low power consumption driven at a low voltage, for example. When the Al composition ratio on the electron blocking layer 34 side of AlGaN of the first composition change region 321 is higher than the Al composition ratio of the electron blocking layer 34, the change rate in the layer of the Al composition ratio of the first composition change region 321 can be increased, and therefore the carrier density by polarization doping can be increased. In this case, the element resistance can be reduced, and therefore the element is suitable for a high-output light emitting element driven at a high voltage in a high current or a laser diode having a high threshold current density Jth, for example. When the Al composition ratio on the electron blocking layer 34 side of AlGaN of the first composition change region 321 is lower than the Al composition ratio of the electron blocking layer 34, high internal efficiency can be realized even at a low carrier density with a small current value by utilizing a two-dimensional hole gas generated due to the Al composition ratio difference between the electron blocking layer 34 and the first composition change region 321, and therefore the element is suitable for a light emitting diode requiring a high light emission property even at a low current. The composition change of the composition change layer 32 can be specified by the energy dispersive X-ray analysis (EDX) of the cross-sectional structure. Specifically, measurement having 10 or more measurement points is carried out in the target layer on the condition of having a resolution at a distance of 1/10 or less at most to the film thickness of the layer considered to be the composition change layer 32. When the Al composition ratio is linear to the film thickness, this structure is regarded to be continuous. At this time, as the definition of the linearity, there is a difference in the Al composition ratios of at least 3 or more measurement points and the determination constant is 0.95 or more when linear regression is carried out in a graph in which the Al composition ratios obtained as the measurement result are plotted to the film thickness. When the determination constant is set to $R^2$, the determination constant can be defined by the following expression (3).

[Expression 3]

$$R^2 = 1 - \frac{\sum_{i=1}^{n}(y_i - f(x_i))^2}{\sum_{i=1}^{n}(y_i - e_y)^2} \qquad (3)$$

In Expression (3), $y_i$ indicates the Al composition ratio at a measurement point i, $e_y$ indicates the average value of the Al composition ratios at all the measurement points, and $f(x_i)$ indicates a predicted value at a position xi of the regression line. The measurement point closest to the active layer 352 among the measurement points is considered to be a first measurement point. A second measurement point, a third measurement point, and so on (the same continues hereinafter) are defined with an increase in the distance from the active layer 352.

When the determination constant is 0.7 or more and less than 0.95 in the selected film thickness, the determination constant does not fit with the definition of the first composition change region 321. In that case, there is a possibility that the first composition change regions 321 are laminated in a multistage while changing the gradient rate (i.e., change rate) in the film thickness selected for performing the measurement. Therefore, the selected film thickness is shortened and the measurement is performed again. The maximum film thickness at which the determination constant is 0.95 or more is defined as the film thickness of the first composition change region 321. Similarly, when the determination constant is 0.7 or more and less than 0.95 in the selected film thickness, the determination constant does not fit with the definition of the first composition change region 321. In that case, the film thickness range is excessively small, and thus there is a possibility that a measurement error or an Al composition variation in a usual thin film growth is measured rather than the gradient rate (i.e., change rate) of the Al composition of the first composition change region 321. Therefore, the selected film thickness is lengthened and the measurement is performed again. When the film thickness at which the determination constant is 0.95 or more is present in larger film thicknesses when the measurement is performed again, the film thickness is defined as the film thickness of the first composition change region 321. When the film thickness is larger than 0 nm and smaller than 400 nm, a region having the film thickness is regarded as the first composition change region 321.

In the case of this definition, the present invention also actually includes some of stair structures in which a minute region where the composition difference of the Al composition changes and a minute region where the composition difference of the Al composition is constant are combined so that the Al composition is stepwisely reduced and structures in which the Al composition continuously changes and the gradient rate (i.e., change rate) also continuously changes. When the effects of the present invention are considered, the structures should be included in the present invention, and therefore are defined as the first composition change region 321 in the present invention. The composition change layer 32 described below is also similarly defined.

Next, a distinction from the second composition change region 322 described below is described. For example, it is a matter of course that a structure in which a first layer with a thickness of 220 nm in which the Al composition ratio continuously decreases from 0.9 to 0.5 and a second layer with a thickness of 30 nm in which the Al composition ratio continuously decreases from 0.5 to 0.3 are combined is defined as the first composition change region 321 and the second composition change region 322 of the present invention. When 9 measurement points are extracted from the first layer and 1 measurement point is extracted from the second layer as the measurement points to be measured by the EDX, the determination constant of the regression curve is 0.95 or more in some cases depending on the selection of the measurement point. In such a case, the selected film thickness region of the first composition change region 321 is wrong. When the gradient rates (i.e., change rates) of the first composition change region 321 and the second composition change region 322 can be distinguished according to the definition above in a smaller film thickness, the structure is defined as the structure in which the first composition change region 321 and the second composition change region 322 contained in the present invention are combined. The change rate of the Al composition ratio to the film thickness of the first composition change region 321 is defined as the gradient of the regression line determined above.

Figure 4:
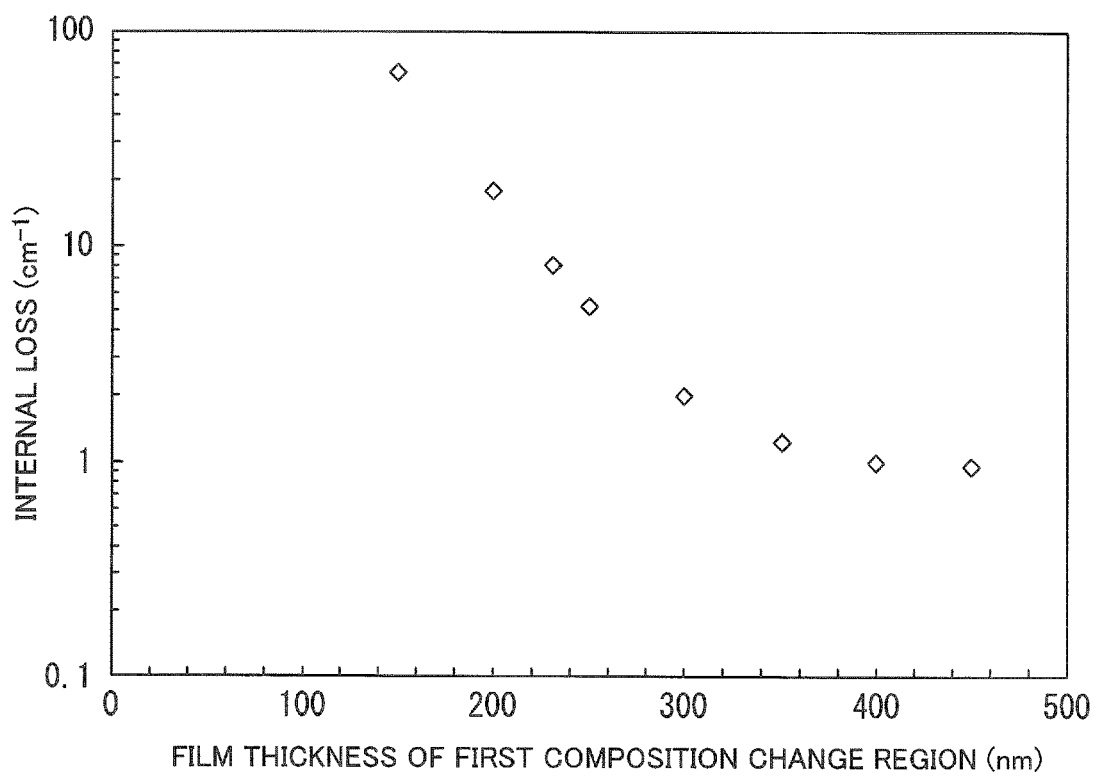
FIG. 4 is a graph illustrating an example of an internal loss to the film thickness of a first composition change region configuring a composition change layer provided in the nitride semiconductor element according to the first embodiment of the present invention.

The film thickness of the first composition change region 321 is described using FIG. 4 referring to FIG. 1 and FIG. 2. FIG. 4 is a graph illustrating an example of simulation results of the internal loss to the film thickness of the first composition change region 321 of the composition change layer 32 provided in the nitride semiconductor element 1. In FIG. 4, the horizontal axis represents the film thickness (nm) of the first composition change region 321 and the vertical axis represents the internal loss ($cm^{-1}$). In the simulation results, the simulation was carried out based on a design in which the internal efficiency and the light confinement coefficient do not almost change and the film thickness of the nitride semiconductor active layer 352 is the same, and therefore the internal loss $\alpha i$ serves as a control factor of the threshold current density Jth.

As illustrated in Expression (2), the oscillation threshold gain gth of the nitride semiconductor element 1 becomes lower as the internal loss $\alpha i$ is lower. Therefore, in the viewpoint of the oscillation of the nitride semiconductor element 1, the film thickness of the first composition change region 321 may be 0 nm to 400 nm. From the simulation results, a reduction in the internal loss is observed at 150 nm or more in the first composition change region 321 and the internal loss is an almost same value at 400 nm or more as illustrated in FIG. 4. More specifically, as the laser diode characteristic, the film thickness is preferably 150 nm or more. The calculation can be performed in the simulation but, in actual, when the film thickness of the first composition change region 321 is a thickness of 400 nm or more, the resistance of the first composition change region 321 increases and an increase in the heat generation amount due to an increase in a driving voltage occurs, so that the breakdown of the nitride semiconductor element 1 is likely to occur. More specifically, the first composition change region 321 is required to be smaller than 400 nm. Although described later, even when the first composition change region 321 is a region having a thickness larger than 0 nm and smaller than 150 nm, a high current density of 1 $kA/cm^2$ or more can be realized. A light emitting diode (LED) having no necessity of light confinement, for example, has an effect that a good element can be produced which realizes a high current density even when the film thickness of the first composition change region 321 is larger than 0 nm and smaller than 150 nm. As a laser diode, the film thickness of the first composition change region 321 is more preferably 150 nm or more and less than 400 nm. The film thickness of the first composition change region 321 is more preferably 200 nm or more and less than 400 nm from the viewpoint of further reducing the internal loss $\alpha i$. Furthermore, the film thickness of the first composition change region 321 is more preferably 300 nm or more and less than 400 nm from the viewpoint of reducing the internal loss $\alpha i$.

Next, the film thickness of the first composition change region 321 based on the viewpoints of the maximum current density, the voltage at the maximum current, and the non-defective electrical product yield of the nitride semiconductor element 1 are described. In order to examine the film thickness of the first composition change region 321 based on the viewpoints above of the nitride semiconductor element 1, the maximum current density, the voltage at the maximum current, and the non-defective electrical product yield to the first composition change region 321 were measured by actually producing elements. For the convenience of a description of this measurement, the reference numerals of the nitride semiconductor element 1 according to this embodiment and the constituent components of the nitride semiconductor element 1 are used for nitride semiconductor elements and constituent components of the nitride semiconductor elements used for the measurement.

54 samples were produced for each of five kinds of samples which have the same configuration as that of the nitride semiconductor element 1 and in which the film thickness of the first composition change region 321 was changed in the measurement of the maximum current density, the voltage at the maximum current, and the non-defective electrical product yield of the nitride semiconductor element 1. Specifically, the five kinds of samples include a sample A1 in which the film thickness of the first composition change region 321 is 40 nm, a sample A2 in which the film thickness is 75 nm, a sample A3 in which the film thickness is 245 nm, a sample A4 in which the film thickness is 374 nm, and a sample A5 in which the film thickness is 404 nm. Although the parameters, such as the composition, of each layer of the nitride semiconductor elements 1 of the samples A1 to A5 are almost the same as those of the basic model of the current simulation illustrated in Table 1 above, the following parameters are different besides the film thickness of the first composition change region.
(1) Film thickness of second composition gradient layer: 75 nm
(2) Al composition ratio of light emitting layer of nitride semiconductor active layer: 35%
(3) Film thickness of first nitride semiconductor layer: 3000 μm
(4) Film thickness of AlN layer: 1600 nm A current density J in the nitride semiconductor element 1 is defined as in the following expression (4) using a current I flowing in the nitride semiconductor element 1 from the first electrode 14 toward the second electrode 15 and an area S where the first electrode 14 contacts the second nitride semiconductor layer 33. Expression (4) is expressed using the marks of the current density J, the current I, and the area S.

$$J=I/S \tag{4}$$

The maximum current density J max of the nitride semiconductor element 1 is based on a current value immediately before the nitride semiconductor element 1 is broken by gradually increasing the voltage value of an applied voltage Va applied between the first electrode 14 and the second electrode 15 at predetermined intervals to increase the current amount of the current I which is caused to flow to the nitride semiconductor element 1. In the calculation of the maximum current density J max, when the voltage-current characteristics of the nitride semiconductor element 1 deviated from the common diode curve, it is determined that the nitride semiconductor element 1 was broken. Specifically, when the measurement at a measurement point next to the measurement point where the maximum current density J max was obtained was carried out, the voltage decreases and the current value excessively increases. The current density based on the current I at the measurement point immediately before (immediately preceding measurement point) deviating from the diode curve is defined as the maximum current density J max. The applied voltage Va at the measurement point immediately before the measurement point (immediately preceding measurement point) where the current-voltage characteristics of the nitride semiconductor element 1 deviate from the common diode curve is defined as the voltage at the maximum current V max. The current-voltage characteristics of the nitride semiconductor element 1 were evaluated by pulse measurement by the applied voltage Va of a pulse signal having a pulse width of 50 nsec and a pulse cycle of 500 μs.

The non-defective electrical product yield is defined as the rate of the nitride semiconductor elements 1 satisfying the following non-defective product conditions among the 54 nitride semiconductor elements 1 for each of the samples A1 to A6.

<Non-Defective Product Conditions>

When CW (Continuous Wave) measurement including performing voltage sweep from 0 V to 20 V between the first electrode 14 and the second electrode 15 on the condition where the upper limit of the current I is set to 20 mA is performed, a current value at 3 V is 1 mA or more and a voltage value at 20 mA is less than 7 V.

Table 2 illustrates the measurement results of the maximum current density, the voltage at the maximum current, and the non-defective electrical product yield to the film thickness of the first composition change region 321. "Sample" illustrated in the first column of Table 2 illustrates the type of the samples of the nitride semiconductor elements 1 used for the measurement. "Thickness of first composition change region [nm]" illustrated in the first column of Table 2 illustrates the film thickness (unit of film thickness is in the square brackets) of the first composition change region 321 provided in the nitride semiconductor elements 1 used for the measurement. "Maximum current density [kA/cm$^2$]" illustrated in the first column of Table 2 illustrates an average value (unit is in the square brackets) of the maximum current densities of the 54 nitride semiconductor elements 1 used for the measurement. "Voltage at maximum current [V]" illustrated in the first column of Table 2 illustrates an average value (unit is in the square brackets) of the voltages at the maximum current applied to the 54 nitride semiconductor elements 1 used for the measurement. "Non-defective electrical product yield [%]" illustrated in the first column of Table 2 illustrates the non-defective electrical product yield (unit is in the square brackets) of each type of the samples used for the measurement.

TABLE 2

| Sample | Thickness of first composition change region [nm] | Maximum current density [kA/cm$^2$] | Voltage at maximum current [V] | Non-defective electrical product yield [%] |
|---|---|---|---|---|
| A1 | 40 | 1.15 | 14.9 | 6 |
| A2 | 75 | 6.87 | 17.9 | 33 |
| A3 | 245 | 47 | 28.0 | 93 |
| A4 | 374 | 1.0 | 34.4 | 14 |
| A5 | 404 | 0.39 | 38.2 | 39 |

As illustrated in Table 2, the nitride semiconductor elements 1 of the sample A1 have the smallest film thickness of the first composition change region 321 as compared with that of the nitride semiconductor elements 1 of the samples A2 to A5. Therefore, the nitride semiconductor elements 1 of the sample A1 have a low electron blocking effect in the first composition change region 321, and therefore a leakage defect is likely to occur. This indicates that not only the electron blocking layer 34 but the first composition change region 321 contribute to the blocking of electrons. Thus, the nitride semiconductor elements 1 of the sample A1 are broken due to a leakage even under high current injection and a high current cannot be caused to flow, and thus the maximum current density J max is 1.15 kA/cm$^2$ which is lower than that of the nitride semiconductor elements 1 of the samples A2 to A4. However, the maximum current density J max is higher than 1 kA/cm$^2$, and therefore the nitride semiconductor elements 1 of the sample A1 also have the effects of the present invention. Moreover, the non-defective electrical product yield of the nitride semiconductor elements 1 of the sample A1 is 6(%), so that the non-defective electrical product yield is the lowest among the nitride semiconductor elements 1 of the samples A1 to A5. More specifically, the nitride semiconductor elements 1 of the sample A1 are most likely to cause a leakage defect among the nitride semiconductor elements 1 of the samples A1 to A5.

The nitride semiconductor elements 1 of the sample A5 have the largest film thickness of the first composition change region 321 as compared with that of the nitride semiconductor elements 1 of the samples A1 to A4. Therefore, the nitride semiconductor elements 1 of the sample A5 have resistance higher than that of the nitride semiconductor elements 1 of the samples A1 to A4, and therefore the applied voltage Va under energization increases, so that thermal breakdown is likely to occur. Therefore, the maximum current density J max of the nitride semiconductor elements 1 of the sample A5 is 0.39 kA/cm², and thus it is difficult to realize a high current density of 1 kA/cm² or more.

The nitride semiconductor elements 1 of the sample A3 have the first composition change region 321 having an almost intermediate film thickness in the film thickness range of the first composition change region 321 of the nitride semiconductor elements 1 of the samples A1 to A5. Therefore, the nitride semiconductor elements 1 of the sample A3 have a higher electron blocking effect in the first composition change region 321 and are less likely to cause a leakage defect as compared with that of the nitride semiconductor elements 1 of the sample A1. Moreover, in the nitride semiconductor elements 1 of the sample A3, the resistance of the nitride semiconductor element 1 is lower than that of the nitride semiconductor elements 1 of the sample A5, and therefore the applied voltage Va under energization becomes low and thermal breakdown is difficult to occur. Thus, the nitride semiconductor elements 1 of the sample A3 have a good balance between the electron blocking effect in the first composition change region 321 and the resistance value of the nitride semiconductor element 1. As a result, the maximum current density J max of the nitride semiconductor elements 1 of the sample A3 is 47 kA/cm², and thus a high current is easily caused to flow and the non-defective electrical product yield is 93%, which is higher than that of the nitride semiconductor elements 1 of the samples A1, A2, A4, A5.

In the nitride semiconductor element 1 bearing the current density having the maximum current density J max of 1 kA/cm², i.e., the nitride semiconductor element 1 having the maximum current density J max of 1 kA/cm², the element area can be reduced. In terms of the laser oscillation threshold, a current density of 1 kA/cm² or more is required for the laser oscillation. Therefore, it is more preferable for the nitride semiconductor element 1 to be durable for a current density of 1 kA/cm² or more, e.g., a current density of 5 kA/cm² or 10 kA/cm².

Thus, the optimal film thickness is present in the first composition change region 321 provided in the nitride semiconductor element 1 from the viewpoints of the oscillation, the maximum current density, the voltage at the maximum current, and the non-defective electrical product yield. Due to the fact that the film thickness of the first composition change region 321 is larger than 0 nm, the number of the nitride semiconductor elements 1 causing a leakage defect decreases. Therefore, the film thickness of the first composition change region 321 is required to be larger than 0 nm. When the film thickness of the first composition change region 321 is 400 nm or more, the number of the nitride semiconductor elements 1 causing an energization breakdown defect increases. Therefore, the film thickness of the first composition change region 321 is required to be smaller than 400 nm. Hence, the first composition change region 321 may have a thickness larger than 0 nm and smaller than 400 nm, for example, in the nitride semiconductor element 1 according to this embodiment.

According to an operation simulation of the nitride semiconductor element 1, the laser oscillation can be confirmed when the film thicknesses of the first composition change region 321 is 150 nm or more and less than 400 nm. Therefore, the nitride semiconductor element 1 may have the first composition change region 321 having a film thickness of 150 nm or more and less than 400 nm. Moreover, it can be confirmed by the operation simulation of the nitride semiconductor element 1 that, when the film thicknesses of the first composition change region 321 is 200 nm or more and less than 400 nm, the internal loss αi decreases, and therefore the oscillation threshold gain gth decreases. Hence, the nitride semiconductor element 1 may have the first composition change region 321 having a film thickness of 200 nm or more and less than 400 nm. Furthermore, it can be confirmed by the operation simulation of the nitride semiconductor element 1 that, when the film thicknesses of the first composition change region 321 is 300 nm or more and less than 400 nm, the internal loss αI decreases and becomes constant, and thus the oscillation threshold gain gth becomes constant. Therefore, the nitride semiconductor element 1 may have the first composition change region 321 having a film thickness of 300 nm or more and less than 400 nm. When the oscillation threshold gain gth becomes constant, an oscillation defect is difficult to occur in the nitride semiconductor element 1 even when the film thickness of the first composition change region 321 varies in manufacturing. Thus, the nitride semiconductor element 1 can achieve an improvement of the manufacturing yield. When the film thickness of the first composition change region 321 is less than 150 nm, the nitride semiconductor element 1 can emit light but cannot oscillate in the simulation.

Figure 5:
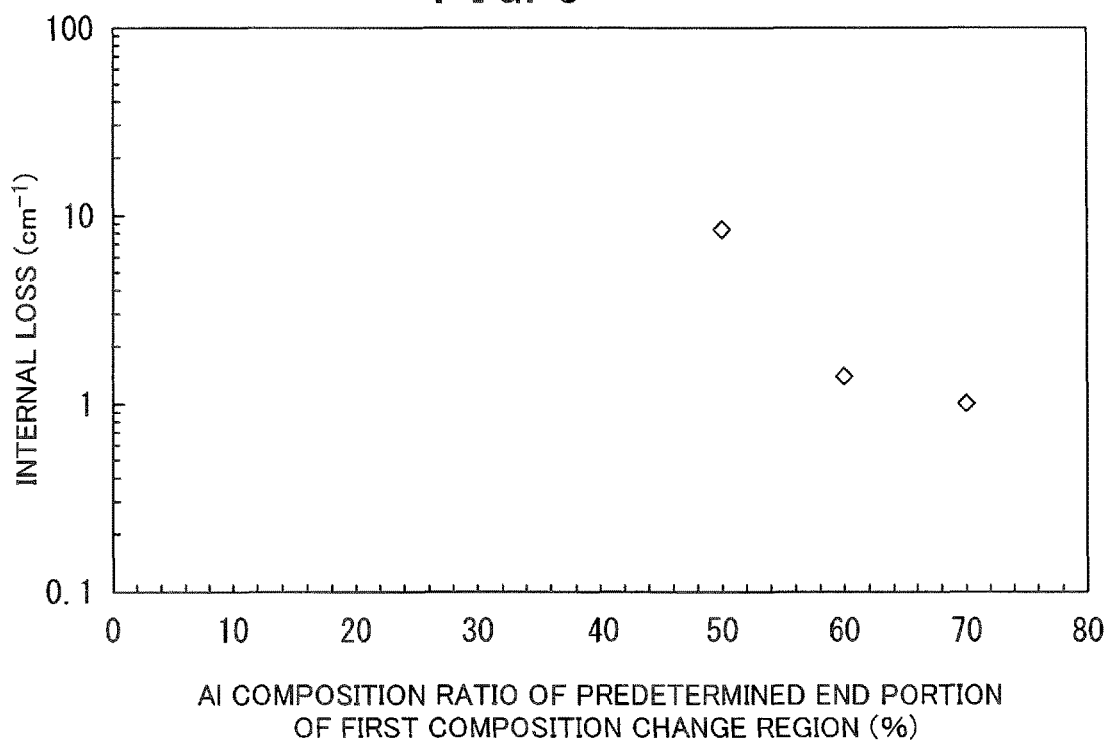
FIG. 5 is a graph illustrating an example of an internal loss to the Al composition ratio of a predetermined end portion of the first composition change region configuring the composition change layer provided in the nitride semiconductor element according to the first embodiment of the present invention.

Next, the Al composition ratio x3 of the first composition change region 321 is described using FIG. 5 referring to FIG. 1 and FIG. 2. FIG. 5 is a graph illustrating an example of simulation results of the internal loss to the Al composition ratio of a predetermined end portion of the first composition change region 321 of the composition change layer 32 provided in the nitride semiconductor element 1. The predetermined end portion of the first composition change region 321 is an end portion of the first composition change region 321 on the side opposite to the side in which the nitride semiconductor active layer 352 is arranged. In other words, the predetermined end portion of the first composition change region 321 is an end portion on the side in contact with the second composition change region 322. In FIG. 5, the horizontal axis represents the Al composition ratio (%) of the predetermined end portion of the first composition change region 321 and the vertical axis represents the internal loss (cm$^{-1}$).

As illustrated in FIG. 5, the internal loss αi becomes lower as the Al composition ratio x3 of the predetermined end portion of the first composition change region 321 is higher. In the simulation results, the simulation was carried out based on a design in which the internal efficiency and the light confinement coefficient do not almost change, the mirror loss αm is also constant at 34.3 cm$^{-1}$, and the film thickness of the nitride semiconductor active layer 352 is the same, and therefore the internal loss αi serves as a control factor of the oscillation threshold gain gth.

The oscillation threshold gain gth of the current of the nitride semiconductor element 1 becomes lower as the internal loss αi is lower. Therefore, it is indispensable that the Al composition ratio x3 of the first composition change region 321 is 50% or more, for example, in this calculation. More specifically, the lower limit of the Al composition ratio x3 of the predetermined end portion of the first composition change region 321 is 50% (0.5), for example. This is in agreement with the Al composition ratios x4 of the lower guide layer 351 and the upper guide layer 353. More specifically, unless the lower limit of the Al composition ratio x3 of the predetermined end portion of the first composition change region 321 is larger than the Al composition ratios x4 of the lower guide layer 351 and the upper guide layer 353, light cannot be effectively confined in the lower guide layer 351 and the upper guide layer 353, so that the internal loss αi increases. The upper limit of the Al composition ratio x3 of the predetermined end portion of the first composition change region 321 is determined considering the conductivity of the nitride semiconductor element 1. In this embodiment, the upper limit of the Al composition ratio x3 of the first composition change region 321 is set to 80%, for example.

When a thin film structure changed from the thin film structure of the sample A3 described above only in the points that the Al composition ratio of the electron blocking layer is set to 1 and the Al composition ratio of the first composition change region 321 decreases from 1 to 0.5 is grown on a 2 inch +c-plane sapphire substrate, cracks were observed in a region from the peripheral end to the half of the 2 inch +c-plane sapphire substrate. This is considered that, due to the fact that the Al composition ratio on the upper guide layer 353 side of the first composition change region 321 is high, the cracks were occurred by a tensile stress. Considering the description above, the Al composition of the end surface on the upper guide layer 353 side of the first composition change region 321 may be 0.2 or more and 1 or less, may be preferably 0.5 or more and less than 1, and may be more preferably 0.5 or more and 0.8 or less in the present invention. The Al composition ratio of the end surface on the upper guide layer 353 side of the first composition change region 321 can be specified by the energy dispersive X-ray analysis (EDX) of the cross-sectional structure. The Al composition ratio can be defined as the ratio of the number of moles of Al to the sum of the number of moles of Al and Ga and can be defined, and the Al composition ratio can be specifically defined by using values of the number of moles Al, Ga analyzed and quantified from the EDX. In this case, a regression line is determined at the film thickness defined as the first composition change region 321, and the Al composition ratio indicated by the regression line at the position closest to the upper guide layer 353 side in a region in the defined film thickness range is defined as the Al composition ratio of the end surface on the upper guide layer 353 side of the first composition change region 321.

In the end portion of the first composition change region 321 on the side opposite to the side in which the nitride semiconductor active layer 352 is arranged (see FIG. 1), the Al composition ratio x3 may be equal to or higher than the Al composition ratio x4 of the upper guide layer 353. The end portion of the first composition change region 321 on the side opposite to the side in which the nitride semiconductor active layer 352 is arranged (see FIG. 1) is an end portion on the side where the upper guide layer 353 is not disposed of both end portions in the film thickness direction of the first composition change region 321. In other words, the end portion of the first composition change region 321 on the side opposite to the side in which the nitride semiconductor active layer 352 is arranged is an end portion on the side of the boundary with the second composition change region 322 of both the end portions in the film thickness direction of the first composition change region 321. The end portion of the first composition change region 321 on the side opposite to the side in which the nitride semiconductor active layer 352 is arranged may be formed so that the Al composition ratio x3 is higher by 10% or more, for example, than the Al composition ratio x4 of the upper guide layer 353. Thus, due to the fact that the Al composition ratio x3 of the end portion of the first composition change region 321 is set to be higher than the Al composition ratio x4 of the upper guide layer 353, the internal loss αi can be reduced, and therefore the nitride semiconductor element 1 can further reduce the oscillation threshold gain gth. The Al composition ratio of the end surface on the second composition change region 322 side of the first composition change region 321 can be specified by the energy dispersive X-ray analysis (EDX) of the cross-sectional structure. The Al composition ratio can be defined as the ratio of the number of moles of Al to the sum of the number of moles of Al and Ga and can be defined, and the Al composition ratio can be specifically defined by using values of the number of moles Al, Ga analyzed and quantified from the EDX. In this case, a regression line is determined at the film thickness defined as the first composition change region 321, and the Al composition ratio indicated by the regression line at the position closest to the second composition change region 322 side in a region in the defined film thickness range is defined as the Al composition ratio of the end surface on the second composition change region 322 side of the first composition change region 321.

Figure 6:
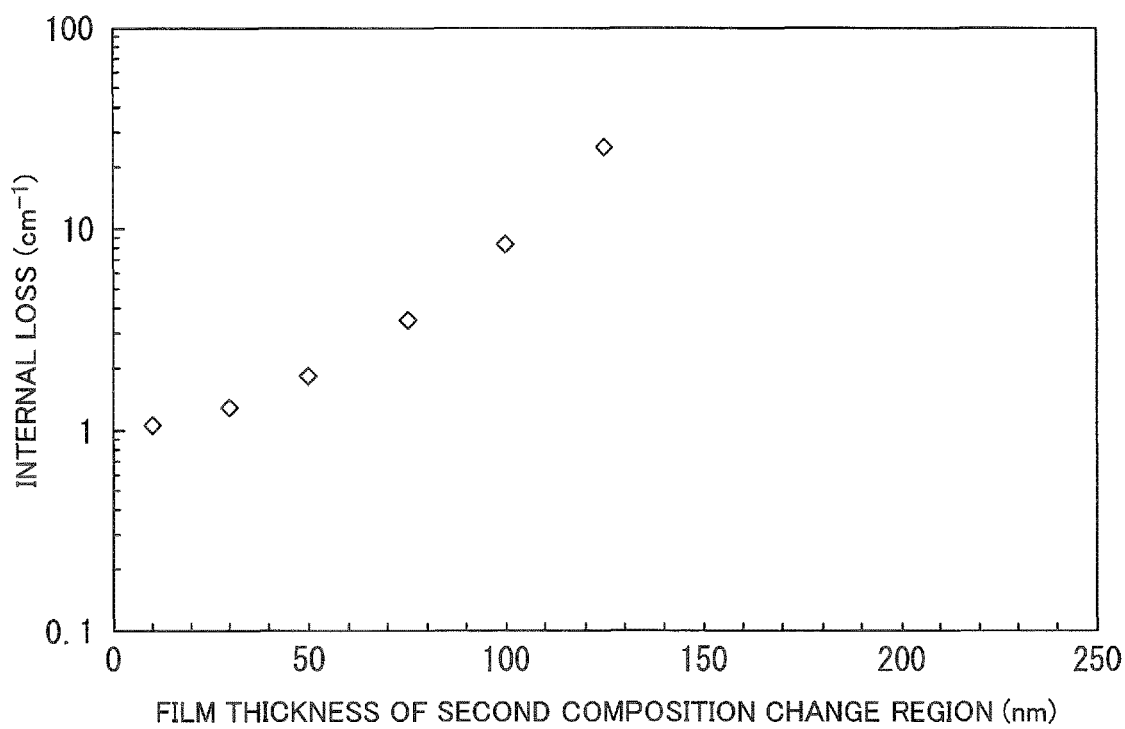
FIG. 6 is a graph illustrating an example of an internal loss to the film thickness of a second composition change region configuring the composition change layer provided in the nitride semiconductor element according to the first embodiment of the present invention.

Next, the second composition change region 322 configuring the composition change layer 32 is described. First, the film thickness of the second composition change region 322 is described using FIG. 6 referring to FIG. 1 and FIG. 2. FIG. 6 is a graph illustrating an example of simulation results of the internal loss to the film thickness of the second composition change region 322 of the composition change layer 32 provided in the nitride semiconductor element 1. In FIG. 6, the horizontal axis represents the film thickness (nm) of the second composition change region 322 and the vertical axis represents the internal loss ($cm^{-1}$).

As illustrated in FIG. 6, the internal loss αi becomes lower as the film thickness of the second composition change region 322 is smaller. In the simulation results, the simulation was carried out based on a design in which the internal efficiency and the light confinement coefficient do not almost change, the mirror loss αm is also constant at 34.3 $cm^{-1}$, and the film thickness of the nitride semiconductor active layer 352 is the same, and therefore the internal loss αi serves as a control factor of the oscillation threshold gain gth.

The oscillation threshold gain gth of the nitride semiconductor element 1 becomes lower as the internal loss αi is lower. Therefore, in the viewpoint of the oscillation of the nitride semiconductor element 1, the film thickness of the second composition change region 322 may be 130 nm or less.

The nitride semiconductor element 1 contains the second composition change region 322 as an indispensable constituent component in order to inject carriers from the first electrode 14 to the first composition change region 321. AlGaN configuring the second composition change region 322 may contain impurities, such as Group V elements other than N, such as P, As, or Sb, Group III elements, such as In or B, C, H, F, O, Si, Cd, Zn, or Be. AlGaN configuring the second composition change region 322 may contain Si as an n-type semiconductor dopant and Mg as a p-type semiconductor dopant. The second composition change region 321 is a region where the Al composition ratio continuously decreases and holes are generated by polarization in the +c-plane growth. In this case, the second composition change region 322 may contain Mg as a dopant. In the −c-plane growth, electrons are generated by polarization. In this case, the second composition change region 322 may contain Si as a dopant. The second composition change region 322 may be an undoped layer not containing Si and Mg as a dopant. By forming the second composition change region 322 into an undoped layer, the absorption light due to impurities can be suppressed and the internal loss can be reduced in a laser diode. Also in a light emitting diode, the light extraction efficiency is improved by suppressing the light absorption, so that the luminous efficiency can be improved. The second composition change region 322 may also directly contact the first composition change region 321. Moreover, an AlGaN layer which is a mixed crystal of AlN and GaN with a constant composition may also be included between the first composition change region 321 and the second composition change region 322. The Al composition ratio on the first composition change region 321 side of the second composition change region 322 may be the same as, higher than, or lower than the Al composition ratio on the second composition change region 322 side of the first composition change region 321. The Al composition ratio on the first composition change region 321 side of the second composition change region 322 is preferably the same as or lower than the Al composition ratio on the second composition change region 322 side of the first composition change region 321. This is suitable for an element with low power consumption because an element in which the diode rising voltage is low can be produced by eliminating the barrier between the first composition change region 321 and the second composition change region 322. The composition change of the second composition change region 322 can be specified by the energy dispersive X-ray analysis (EDX) of the cross-sectional structure as with the composition change of the first composition change region 321. Specifically, measurement having 10 or more measurement points is carried out in the target layer on the condition of having a resolution at a distance of 1/10 or less at most to the film thickness of the layer considered to be the second composition change region 322. When the Al composition ratio is linear to the film thickness, it is regarded that the change in the Al composition ratio is continuous in this structure. At this time, the linearity is defined as with the first composition change region 321.

Next, a distinction between the second composition change region 322 and the other layers is described. For example, it is a matter of course that a layer having a structure in which a third layer having a thickness of 75 nm in which the Al composition ratio decreases from 0.5 to 0 and a fourth layer having a thickness of 50 nm in which the Al composition ratio is constant at 0 are combined is defined as the second composition change region 322 of the present invention. When 9 measurement points are extracted from the third layer and 1 measurement point is extracted from the fourth layer as the measurement points to be measured by the EDX, the determination constant of the regression curve is 0.95 or more in some cases depending on the selection of the measurement point. In such a case, the selected film thickness region of the second composition change region 322 is wrong. When a layer corresponding to the second composition change region 322 is present according to the definition above in a smaller film thickness, the layer is defined as the second composition change region 322 contained in the present invention. The change rate of the Al composition ratio to the film thickness of the second composition change region 322 is defined as the gradient of the regression line determined above.

The change rate (gradient rate) of the Al composition ratio to the film thickness of the second composition change region 322 is required to be higher than the change rate of the first composition change region 321. This is because the function of the second composition change region 322 is efficiently causing a current to flow to the first composition change region 321 and suppressing an increase in the internal loss due to a leakage of light described later. In a case where there is a plurality of layers corresponding to the second composition change region 322, when at least one of the plurality of layers satisfies the definition of the second composition change region 322, the structure is regarded as the structure of the present invention.

When the Al composition ratio of the first composition change region 321 and the Al composition ratio of the second composition change region 322 continuously change, the Al composition ratio of the interface where the first composition change region 321 and the second composition change region 322 contact each other is defined as the Al composition ratio at the intersection between the regression line of the first composition change region 321 defined above and the regression line of the second composition change region 322.

There is a possibility that the second composition change region 322 contains a layer having the Al composition ratio lower than the Al composition ratios x4 of the lower guide layer 351 and the upper guide layer 353. This layer has a risk that light emitted in the light emitting unit 35 leaks to the second composition change region 322, the second nitride semiconductor layer 33, and the first electrode 14. Moreover, there is a possibility that the second composition change region 322 contains a layer having the Al composition ratio lower than the Al composition ratio of the well layers 352a of the nitride semiconductor active layer 352. There is a possibility that the layer absorbs light emitted in the light emitting unit 35. The second composition change region 322 is required to be as thin as possible in order to reduce a light leakage due to the layer having the Al composition ratio lower than the Al composition ratios x4 of the lower guide layer 351 and the upper guide layer 353. Therefore, in order to realize the present invention, it is indispensable that the film thickness of the second composition change region 322 is reduced by increasing the composition change rate thereof to be larger than the composition change rate of the first composition change region 321. As a result of performing a simulation for obtaining the characteristics illustrated in FIG. 6, the oscillation in the nitride semiconductor element 1 was confirmed when the film thickness of the second composition change region 322 is smaller than 200 nm. Therefore, in the nitride semiconductor element 1, the second composition change region 322 may have a thickness larger than 0 nm and smaller than 200 nm. In order to reduce the resistance of the nitride semiconductor element 1, reduce the driving voltage low, and reduce the heat generation amount to suppress the breakdown of the nitride semiconductor element 1, the film thickness of the second composition change region 322 is preferably smaller.

Moreover, the nitride semiconductor element 1 may have the second composition change region 322 formed to have a film thickness larger than 0 nm and smaller than 150 nm in order to reduce the oscillation threshold gain gth. Moreover, the nitride semiconductor element 1 may have the second composition change region 322 formed to have a film thickness larger than 0 nm and smaller than 100 nm in order to reduce the oscillation threshold gain gth to a very low level. Furthermore, the nitride semiconductor element 1 may have the second composition change region 322 formed to have a film thickness larger than 10 nm and 100 nm or less in order to improve the reproducibility of the composition change (i.e., composition gradient) in the second composition change region 322.

Figure 7:
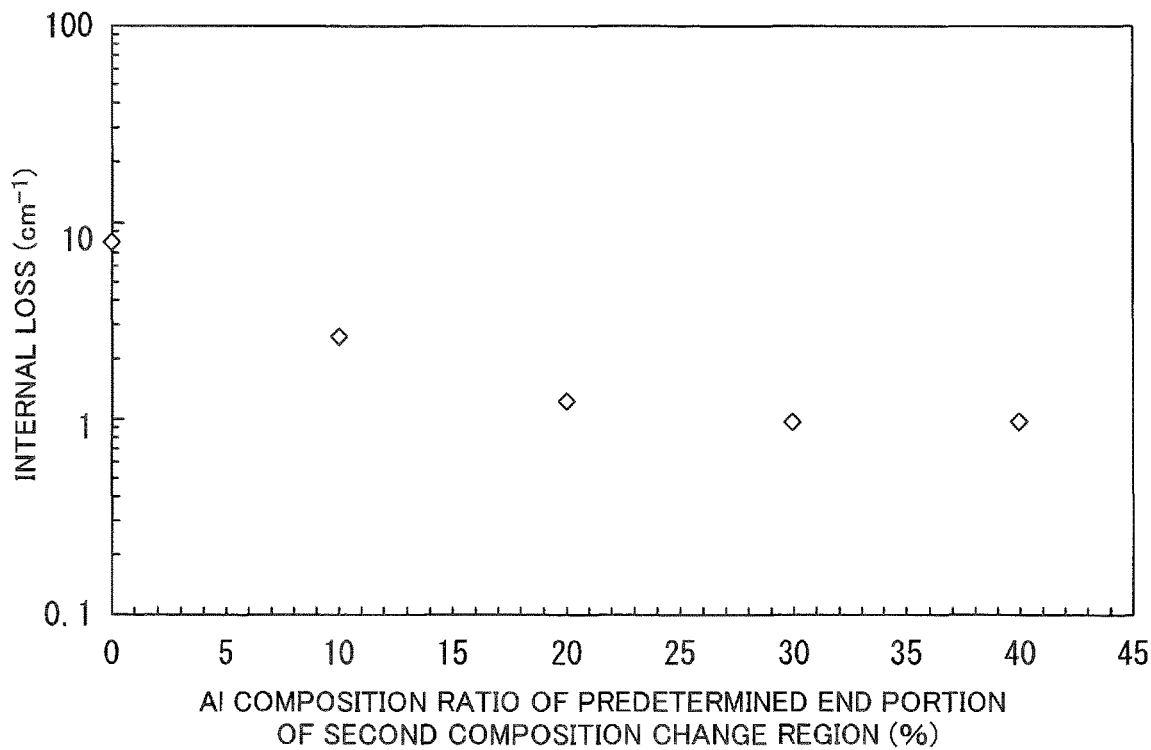
FIG. 7 is a graph illustrating an example of an internal loss to the Al composition ratio of a predetermined end portion of the second composition change region configuring the composition change layer provided in the nitride semiconductor element according to the first embodiment of the present invention.

Next, the Al composition ratio x3 of the second composition change region 322 is described using FIG. 7 referring to FIG. 1 and FIG. 2. FIG. 7 is a graph illustrating an example of simulation results of the internal loss to the Al composition ratio x3 in a predetermined end portion of the second composition change region 322 of the composition change layer 32 provided in the nitride semiconductor element 1. The predetermined end portion of the second composition change region 322 is an end portion of the second composition change region 322 on the side opposite to the side in which the nitride semiconductor active layer 352 is arranged. In other words, the predetermined end portion of the second composition change region 322 is an end portion on the side opposite to the side of the boundary with the first composition change region 321. In still other words, the predetermined end portion of the second composition change region 322 is an end portion on the side in contact with the second nitride semiconductor layer 33. In FIG. 7, the horizontal axis represents the Al composition ratio in the predetermined end portion of the second composition change region 322 (%) and the vertical axis represents the internal loss ($cm^{-1}$). In the simulation results, the simulation was carried out based on a design in which the internal efficiency, the mirror loss $\alpha m$ is also constant at 34.3 $cm^{-1}$, and the light confinement coefficient do not almost change, and the film thickness of the nitride semiconductor active layer 352 is the same, and therefore the internal loss $\alpha i$ serves as a control factor of the oscillation threshold gain gth.

As illustrated in FIG. 7, the internal loss $\alpha i$ becomes lower as the Al composition ratio x3 is lower in the range where the Al composition ratio x3 in the predetermined end portion of the second composition change region 322 is 0% to 30%. The internal loss $\alpha i$ is almost constant in the range where the Al composition ratio x3 in the predetermined end portion of the second composition change region 322 is 30% or more. On the other hand, the mirror loss $\alpha m$ is almost constant at 34.3 $cm^{-1}$ without depending on the Al composition ratio x3 in the predetermined end portion of the second composition change region 322. The internal loss $\alpha i$ becomes lower than mirror loss $\alpha m$ without depending on the Al composition ratio x3 in the predetermined end portion of the second composition change region 322.

The oscillation threshold gain gth of the nitride semiconductor element 1 becomes lower as the internal loss $\alpha i$ is lower. Therefore, the Al composition ratio x3 in the predetermined end portion of the second composition change region 322 may be higher than 0 in the viewpoint of the oscillation. However, when the Al composition ratio x3 in the predetermined end portion of the second composition change region 322 is 0.5 or more (i.e., 50% or more), the resistance value between the composition change layer 32 and the second nitride semiconductor layer 33 increases, so that the injection of a current into the light emitting unit 35 is disabled. Therefore, the end portion (i.e., predetermined end portion) of the second composition change region 322 on the side opposite to the side in which the nitride semiconductor active layer 352 is arranged may have the Al composition ratio x3 of 0 or more and less than 0.5. In order to inject a larger amount of carriers into the composition change layer 32 to facilitate the flow of a current, the Al composition ratio x3 in the predetermined end portion of the second composition change region 322 may be higher than 0 and 0.3 or less (i.e., 30% or less). Furthermore, the Al composition ratio x3 in the predetermined end portion of the second composition change region 322 may be 0.1 or more and 0.3 or less (10% or more and 30% or less). When the Al composition ratio x3 in the predetermined end portion of the second composition change region 322 is the range above, the internal loss $\alpha i$ of the nitride semiconductor element 1 decreases as illustrated in FIG. 7, and therefore the oscillation threshold gain gth can be reduced (see Expression (2)). Herein, the Al composition ratio in the predetermined end portion of the second composition change region 322 is defined as the Al composition ratio at the furthest point from the first composition change region 321 in the film thickness range defined by the above-described method.

Next, the Al composition ratio in the predetermined end portion of the second composition change region 322 based on the viewpoints of the maximum current density, the voltage at the maximum current, and the non-defective electrical product yield of the nitride semiconductor element 1 is described. In order to examine the Al composition ratio x3 in the predetermined end portion of the second composition change region 322 based on the viewpoints above of the nitride semiconductor element 1, the maximum current density, the voltage at the maximum current, and the non-defective electrical product yield to the second composition change region 322 were measured as with the first composition change region 321. For the convenience of a description of this measurement, the reference numerals of the nitride semiconductor element 1 according to this embodiment and the constituent components of the nitride semiconductor element 1 are used for nitride semiconductor elements and constituent components of the nitride semiconductor elements used for the measurement except nitride semiconductor elements as Comparative Examples.

54 samples were produced for each of two kinds of samples which have the same configuration as that of the nitride semiconductor element 1 and in which the Al composition ratio x3 of the second composition change region 322 was changed in the measurement of the maximum current density, the voltage at the maximum current, and the non-defective electrical product yield of the nitride semiconductor element 1. Specifically, the two kinds of samples include a sample B1 in which the film thickness of the second composition change region 322 is 75 nm and the Al composition ratio x3 changes from 50% to 0% and a sample B2 in which the film thickness of the second composition change region 322 is 35 nm and the Al composition ratio x3 changes from 50% to 30%. Furthermore, as Comparative Examples, 54 nitride semiconductor elements of a sample B3 having the same configuration as that of the nitride semiconductor element 1 except not having the second composition change region 322 were produced. Although the parameters, such as the composition, of each layer of the nitride semiconductor elements 1 of the samples B1 and B2 and the nitride semiconductor elements 1 of the samples B3 are almost the same as those of the basic model of the current simulation illustrated in Table 1 above, the following parameters are different besides the film thickness of the second composition change region 322.

(1) Film thickness of first composition gradient layer: 75 nm
(2) Al composition ratio of light emitting layer of nitride semiconductor active layer: 35%
(3) Film thickness of first nitride semiconductor layer: 3000 μm
(4) Film thickness of AlN layer: 1600 nm Methods for calculating the maximum current density J max, the maximum current V max, and the non-defective electrical product yield are the same as those of the film thickness dependency of the first composition change region, and therefore a description thereof is omitted.

Table 3 illustrates the measurement results of the maximum current density J max, the maximum current V max, and the non-defective electrical product yield to the film thickness of the second composition change region 322. "Sample" illustrated in the first column of Table 3 illustrates the type of the samples of the nitride semiconductor elements 1 used for the measurement. "Al composition ratio of second composition change region [%]" illustrated in the first column of Table 3 illustrates the Al composition ratio of the second composition change region 322 provided in the nitride semiconductor elements 1 used for the measurement. "50→0" indicated in the column of "Al composition ratio of second composition change region[%]" illustrates that the Al composition ratio of the second composition change region 322 changes from 50% to 0% from the end portion on the first composition change region 321 side toward the end portion on the second nitride semiconductor layer 33 side. Therefore, in the nitride semiconductor elements 1 of the sample BI, the Al composition ratio x3 in the predetermined end portion of the second composition change region 322 is 0%. "50→30" indicated in the column of "Al composition ratio of second composition change region[%]" illustrates that the Al composition ratio of the second composition change region 322 changes from 50% to 30% from the end portion on the first composition change region 321 side toward the end portion on the second nitride semiconductor layer 33 side. Therefore, in the nitride semiconductor elements 1 of the sample B2, the Al composition ratio x3 in the predetermined end portion of the second composition change region 322 is 30%. Since the nitride semiconductor elements of the sample B3 do not have the second composition change region, "None" is indicated in the column of "Al composition ratio of second composition change region [%]" corresponding to the sample B3.

"Thickness of second composition change region [nm]" illustrated in the first column of Table 3 illustrates the film thickness (unit of film thickness is in the square brackets) of the second composition change region 322 provided in the nitride semiconductor elements 1 used for the measurement. Since the nitride semiconductor elements of the sample B3 do not have the second composition change region, "−" illustrating that there is no concept of the thickness of the second composition change region is indicated in the column of "Thickness of second composition change region [nm]" corresponding to the sample B3.

"Change rate of Al composition ratio [%/nm]" illustrated in the first column of Table 3 illustrates the change rate (unit of change rate is in the square brackets) of the Al composition ratio in the second composition change region 322 provided in the nitride semiconductor elements 1 used for the measurement. The change rate of the Al composition ratio is obtained by dividing the change amount of the Al composition ratio of the second composition change region 322 by the film thickness of the second composition change region 322. More specifically, the change rate of the Al composition ratio is a rate in which the Al composition ratio, which is the number of moles of Al to the total of the number of moles of Al and Ga in AlGaN, changes in the thickness direction of the composition change layer 32. In the nitride semiconductor elements 1 of the sample BI, the change amount of the Al composition ratio of the second composition change region 322 is 50% (=50−0) and the film thickness of the second composition change region 322 is 75 nm, and therefore the change rate of the Al composition ratio is 0.67%/nm (=50/75) In the nitride semiconductor elements 1 of the sample B2, the change amount of the Al composition ratio of the second composition change region 322 is 20% (=50−30) and the film thickness of the second composition change region 322 is 35 nm, and therefore the change rate of the Al composition ratio is 0.57%/nm (=20/35). Since the nitride semiconductor elements of the sample B3 do not have the second composition change region, "−" illustrating that there is no concept of the composition change rate of the second composition change region is indicated in the column of "Change rate of Al composition ratio [%/nm]" corresponding to the sample B3. Moreover, the nitride semiconductor elements 1 of the sample B3 have a non-defective electrical product yield of 0%, and therefore there were no samples in which the maximum current density and the voltage at the maximum current can be measured. Therefore, "−" illustrating that there are no samples in which the maximum current density and the voltage at the maximum current can be measured is indicated in the columns of "Maximum current density [kA/cm$^2$]" and "Voltage at maximum current [V]" corresponding to the sample B3.

"Maximum current density [kA/cm$^2$]" illustrated in the first column of Table 3 illustrates an average value (unit is in the square brackets) of the maximum current densities of the 54 nitride semiconductor elements used for the measurement. "Voltage at maximum current [V]" illustrated in the first column of Table 3 illustrates an average value (unit is in the square brackets) of the voltages at the maximum current applied to the 54 nitride semiconductor elements used for the measurement. "Non-defective electrical product yield [%]" illustrated in the first column of Table 3 illustrates the non-defective electrical product yield (unit is in the square brackets) of each type of the samples used for the measurement.

TABLE 3

| Sample | Al composition ratio of second composition change region [%] | Thickness of second composition change region [nm] | Change rate of Al composition ratio [%/nm] | Maximum current density [kA/cm$^2$] | Voltage at maximum current [V] | Non-defective electrical product yield [%] |
|---|---|---|---|---|---|---|
| B1 | 50→0 | 75 | 0.67 | 6.87 | 17.9 | 33 |
| B2 | 50→30 | 35 | 0.57 | 3.33 | 14.6 | 11 |
| B3 | None | — | — | — | — | 0 |

When the Al composition ratio x3 in the predetermined end portion of the second composition change region 322 is reduced, the energy band gap of the semiconductor in the end portion decreases (see FIG. 2). When the band gap energy becomes lower than that of the well layers 352a, light entering the nitride semiconductor element 1 is absorbed in the second composition change region 322. Therefore, in order to suppress the absorption of the light, the second composition change region 322 is formed so that the Al composition ratio x3 in the predetermined end portion of the second composition change region 322 is as high as possible. However, when the Al composition ratio x3 in the predetermined end portion of the second composition change region 322 increases, the maximum current density and the non-defective electrical product yield tend to decrease as illustrated in Table 3 (see the measurement results of the sample B1 and the sample B2).

Thus, considering the viewpoints of the maximum current density, the non-defective electrical product yield, and the oscillation described above, the end portion (i.e., predetermined end portion) of the second composition change region 322 on the side opposite to the side in which the nitride semiconductor active layer 352 is arranged is formed so that the Al composition ratio x3 is 0 or more and less than 0.5, for example, in the nitride semiconductor element 1 according to this embodiment.

Thus, the composition change layer 32 is made of $Al_{x3}Ga_{(1-x3)}N$ in which the Al composition ratio x3 decreases in a direction away from the nitride semiconductor active layer 352. In this embodiment, the Al composition ratio x3 continuously decreases in both the first composition change region 321 and the second composition change region 322 in the composition change layer 32 (see FIG. 2). The Al composition ratio x3 determining the composition of the composition change layer 32 may change in the range of 0 or more and 1 or less ($0 \leq x3 \leq 1$) on the premise that the change rate of the Al composition ratio x3 is lower in a region on the nitride semiconductor active layer 352 side than in a region on the second nitride semiconductor layer 33 side in the thickness direction of the composition change layer 32. Therefore, the composition change layer 32 has any one of a structure formed only of $Al_{x3}Ga_{(1-x3)}N$ in which the Al composition ratio x3 changes in the range of higher than 0 and lower than 1, a structure formed of AlN and $Al_{x3}Ga_{(1-x3)}N$ in which the Al composition ratio x3 changes in the range of higher than 0 and 1 or less, a structure formed of $Al_{x3}Ga_{(1-x3)}N$ and GaN in which the Al composition ratio x3 changes in the range of 0 or more and lower than 1, and a structure formed of AlN, $Al_{x3}Ga_{(1-x3)}N$, and GaN in which the Al composition ratio x3 changes in the range of 0 or more and 1 or less.

The change rate of the Al composition ratio in the composition change layer 32 is higher than 0.1%/nm. By specifying the change rate of the Al composition ratio in this range, the gradient of the energy is made gentle and holes generated by polarization doping can be dispersed in the composition change layer 32. Thus, the nitride semiconductor element 1 capable of efficiently transporting holes to the nitride semiconductor active layer 352 and having high luminous efficiency can be produced. The minimum value of the Al composition ratio x3 of $Al_{x3}Ga_{(1-x3)}N$ configuring the first composition change region 321 of the composition change layer 32 is set to y1 and the maximum value thereof is set to y2. The minimum value of the Al composition ratio x3 of $Al_{x3}Ga_{(1-x3)}N$ configuring the second composition change region 322 of the composition change layer 32 is set to z1 and the maximum value thereof is set to z2. Thus, in the composition change layer 32, when an end portion on the nitride semiconductor active layer 352 side is formed of $Al_{y2}Ga_{(1-y2)}N$ and the first composition change region 321 and the second composition change region 322 are formed adjacent to each other, an end portion in the first composition change region 321 in a boundary portion between the first composition change region 321 and the second composition change region 322 is formed of $Al_{y1}Ga_{(1-y1)}N$. The Al composition ratios of the first composition change region 321 and the second composition change region 322 in the boundary portion can be specified by the method described above. In the composition change layer 32, an end portion in the second composition change region 322 in the boundary portion between the first composition change region 321 and the second composition change region 322 is formed of $Al_{z2}Ga_{(1-z2)}N$ and an end portion on the side opposite to the nitride semiconductor active layer 352 (i.e., second nitride semiconductor layer 33 side) is formed of $Al_{z1}Ga_{(1-z1)}N$. The minimum value y1 of the Al composition ratio x3 of the first composition change region 321 and the maximum value z2 of the Al composition ratio x3 of the second composition change region 322 may be in agreement with each other and may be different from each other. From the viewpoint of not forming an energy barrier if possible, the minimum value y1 of the Al composition ratio x3 of the first composition change region 321 and the maximum value z2 of the Al composition ratio x3 of the second composition change region 322 may be in agreement with each other or the maximum value z2 may be smaller than the minimum value y1.

The composition change layer 32 is formed so that, between the end portion on the nitride semiconductor active layer 352 side and the end portion in the first composition change region 321 in a boundary portion between the first composition change region 321 and the second composition change region 322, i.e., first composition change region 321, the Al composition ratio x3 of $Al_{x3}Ga_{(1-x3)}N$ continuously decreases from the nitride semiconductor active layer 352 side toward the boundary portion side. The composition change layer 32 is formed so that, between an end portion in the second composition change region 322 in the boundary portion between the first composition change region 321 and the second composition change region 322 and the end portion on the side opposite to the nitride semiconductor active layer 352 side, i.e., second composition change region 322, the Al composition ratio x3 of $Al_{x3}Ga_{(1-x3)}N$ continuously decreases from the boundary portion side toward the side opposite to the nitride semiconductor active layer 352 side. The change rate of the Al composition ratio x3 in the first composition change region 321 is lower than the change rate of the Al composition ratio x3 in the second composition change region 322. Herein, the change rate refers to the gradient ratio of the Al composition ratio to the film thickness. More specifically, an example of the unit of the change rate is "Al %/nm", for example.

Although the first composition change region 321 and the second composition change region 322 are formed in contact with each other to be adjacent to each other in this embodiment, the nitride semiconductor element 1 may have an intermediate layer between the first composition change region 321 and the second composition change region 322. The intermediate layer may have $Al_wGa_{a1-w}N$ ($0<w<1$) in which the composition does not change, a structure in which $Al_wGa_{a1-w}N$ in which the composition does not change and $Al_vGa_{a1-v}N$ ($0<v<w<1$) in which the composition does not change are laminated (corresponding to a superlattice structure in the case of a multistage structure) or the like, for example. When the intermediate layer has the laminated structure, it is preferable to satisfy the relationship of $z2 \leq v < w \leq y1$ from the viewpoint of not forming an energy barrier but the present invention is not limited thereto. When the intermediate layer has the laminated structure, w may be 0.6 and v may be 0.4 as examples of the Al composition ratio w and the Al composition ratio v. The intermediate layer may be a p-type semiconductor, may be an n-type semiconductor, or may be undoped.

Thus, when the intermediate layer is provided between the first composition change region 321 and the second composition change region 322, the predetermined end portion of the first composition change region 321 described using FIG. 5 serves as an end portion on the side in contact with the intermediate layer. Due to the fact that the composition change layer 32 has such an intermediate layer, the second composition change region 322 can be further kept away from the upper guide layer 353. Thus, light emitted in the light emitting unit 35 becomes difficult to leak to the second composition change region 322, and therefore the internal loss can be reduced. The intermediate layer provided between the first composition change region 321 and the second composition change region 322 may have an Al composition ratio higher than that of the well layer 352a. Furthermore, the intermediate layer provided between the first composition change region 321 and the second composition change region 322 may have an Al composition ratio higher than that of the upper guide layer 353. The contact surface of the first composition change region 321 and the intermediate layer and the contact surface of the intermediate layer and the second composition change region 322 may have the same Al composition ratio or different Al compositions. In order to inject carriers, the Al composition ratio gradually becomes higher in the order of the first composition change region 321, the intermediate layer, and the second composition change region 322.

In this embodiment, the minimum value z1 of the Al composition ratio x3 of $Al_{x3}Ga_{(1-x3)}N$ configuring the composition change layer 32 may be 0 or more and less than 0.5 as described above. The minimum value z1 of the Al composition ratio x3 of $Al_{x3}Ga_{(1-x3)}N$ configuring the composition change layer 32 may be equal to or higher than the Al composition ratio of the well layers 352a (see FIG. 2) of the nitride semiconductor active layers 352. Thus, the absorption of light emitted from the well layer 352a by the composition change layer 32 can be suppressed, the internal loss can be reduced in a laser diode, and the light extraction efficiency can be improved in a light emitting diode. The minimum value z1 of the Al composition ratio x3 of $Al_{x3}Ga_{(1-x3)}N$ configuring the composition change layer 32 is the minimum value z1 of the Al composition ratio x3 of the second composition change region 322. Therefore, the minimum value z1 of the Al composition ratio x3 of the second composition change region 322 may be equal to or higher than the Al composition ratio of the well layers 352a of the nitride semiconductor active layer 352. More specifically, in the second composition change region 322, the Al composition ratio in the entire region may be equal to or higher than the Al composition ratio of the well layers 352a of the nitride semiconductor active layer 352.

The minimum value y1 in the first composition change region 321 of the Al composition ratio x3 of $Al_{x3}Ga_{(1-x3)}N$ configuring the composition change layer 32 may be 0.5 or more on the premise of being larger than the minimum value z1. The minimum value y1 in the first composition change region 321 of the Al composition ratio x3 of $Al_{x3}Ga_{(1-x3)}N$ configuring the composition change layer 32 may be equal to or higher than the Al composition ratio x4 of $Al_{x4}Ga_{(1-x4)}N$ configuring the upper guide layer 353. Due to the fact that the minimum value y1 takes an value equal to or larger than the Al composition ratio x4 of $Al_{x4}Ga_{(1-x4)}N$, the first composition change region 321 can be functioned as a light confinement layer in a laser diode, so that a leakage of light to the second composition change region 322 side can be suppressed. Furthermore, the minimum value y1 in the first composition change region 321 of the Al composition ratio x3 of $Al_{x3}Ga_{(1-x3)}N$ configuring the composition change layer 32 may be smaller than the Al composition ratio x1 of the first nitride semiconductor layer 31.

In a light emitting element, efficiently transporting carriers to a light emitting layer and confining carriers in the light emitting layer are designs for obtaining high luminous efficiency. In the composition change layer 32, the Al composition ratio x3 changes, and therefore, by setting the minimum value y1 to be smaller than the Al composition ratio x1 of the first nitride semiconductor layer 31, the heights of energy wells formed in upper and lower layers of the light emitting layer can be set to equal to each other in the upper and lower layers or to be larger on the composition change layer 32 side than on the first nitride semiconductor layer 31 side. When the first nitride semiconductor layer 31 is made of an n-type semiconductor and the composition change layer 32 is made of a p-type semiconductor, the band gap energy on the composition change layer 32 side is preferably higher than the band gap energy of the first nitride semiconductor layer 31 particularly in order to suppress the overflow of electrons to the p-type semiconductor side. In a laser diode, in order to confine light in the nitride semiconductor active layer 352 and increase an overlap of a light intensity distribution with the well layers 352a yielding a gain, it is necessary to achieve the confinement of light due to a refractive index difference by the first nitride semiconductor layer 31 and the composition change layer 32. At this time, in order to balance the refractive indices in the upper and lower layers, the minimum value y1 is preferably smaller than the Al composition ratio x1 of the first nitride semiconductor layer 31. Thus, in spite of the fact that the composition of the composition change layer 32 changes, the band gap energy and the refractive index keeping the balance relative to the first nitride semiconductor layer 31 can be realized.

By forming the composition change layer 32 by controlling the maximum value y2 in the Al composition ratio x3 of $Al_{x3}Ga_{(1-x3)}N$ configuring the composition change layer 32 to a value in the range of larger than 0.5 and 1 or less on the premise of being larger than the value of the minimum value z1, the hole density in the composition change layer 32 by polarization doping is improved. By forming the composition change layer 32 by controlling the maximum value y2 in the Al composition ratio x3 of $Al_{x3}Ga_{(1-x3)}N$ configuring the composition change layer 32 to a value in the range of larger than 0.5 and 1 or less, the effect of confining light emitted in the nitride semiconductor active layer 352 between the lower guide layer 351 and the upper guide layer 353 utilizing the refractive index of the composition change layer 32 is improved. Thus, by optimizing the minimum value z1 and the maximum value y2 of the Al composition ratio x3 of $Al_{x3}Ga_{(1-x3)}N$ configuring the composition change layer 32, both an improvement of the hole density in the composition change layer 32 by polarization doping and an improvement of the light confinement effect of the lower guide layer 351 and the upper guide layer 353 can be achieved. Thus, the nitride semiconductor element 1 can achieve a high output and a reduction in the oscillation threshold in a laser diode.

Due to the fact that the composition change layer 32 is provided, the nitride semiconductor element 1 has effects of suppressing the steep composition change in the composition change layer 32 and the second nitride semiconductor layer 33 and suppressing a deterioration of the crystallinity involving lattice relaxation or a deterioration of the flatness of a thin film due to the involvement of three-dimensional growth.

(Ridge Portion Semiconductor Layer)

The ridge portion semiconductor layer 17 is formed including a part of the composition change layer 32. The ridge portion semiconductor layer 17 has the projection portion 321a formed in the first composition change region 321, the second composition change region 322, and the second nitride semiconductor layer 33. Due to the fact that the ridge portion semiconductor layer 17 is formed in a part of the first composition change region 321, the diffusion of carriers injected from the first electrode 14 in the horizontal direction of the substrate 11 in the ridge portion semiconductor layer 17 is suppressed. Thus, the light emission in the nitride semiconductor active layer 352 is controlled in a region located under the ridge portion semiconductor layer 17 (i.e., region located under the projection portion 321a of the first composition change region 321). As a result, the nitride semiconductor element 1 can realize a high current density and reduce the laser oscillation threshold. The ridge portion semiconductor layer 17 may have conductivity in order to supply electrons or holes to the light emitting unit 35. Examples of materials forming the portion of the ridge portion semiconductor layer 17 except the projection portion 321a of the first composition change region 321 and the second composition change region 322, i.e., second nitride semiconductor layer 33, include AlN, GaN, and a mixed crystal thereof. Specific examples of materials forming the second nitride semiconductor layer 33 include AlGaN. The Al composition ratio of AlGaN of the second nitride semiconductor layer 33 may be the same as or higher than the Al composition ratio x3 (i.e., minimum value z1) of $Al_{x3}Ga_{(1-x3)}N$ in the end portion of the second composition change region 322 on the side opposite to the nitride semiconductor active layer 352 side. Thus, the second nitride semiconductor layer 33 can efficiently transport carriers injected from the first electrode 14 to the light emitting unit 35. The materials forming the second nitride semiconductor layer 33 may contain impurities, such as Group V elements other than N, such as P, As, or Sb, Group III elements, such as In or B, C, H, F, O, Si, Cd, Zn, or Be. Due to the formation of the ridge, materials, such as $SiO_2$ and air, can be disposed on the side surface of the ridge and the confinement of light in the horizontal direction can be realized.

The function of the ridge portion semiconductor layer 17 is concentrating a current and confining light in the horizontal direction to the substrate, and therefore is not always required to be formed only in a part of the first composition change region 321. The ridge portion semiconductor layer 17 may contain a light emitting layer or may contain the first composition change region 321. Furthermore, the ridge portion semiconductor layer 17 may not be present. When the ridge portion semiconductor layer 17 is not present, the composition change layer 32 may be laminated with the same area as that of the mesa portion and the width and the length of the first electrode 14 (details of which are described later) may be designed to appropriate sizes in order to suppress the current injection amount.

When the second nitride semiconductor layer 33 is an n-type semiconductor, the second nitride semiconductor layer 33 can be formed into an n-type by doping the same Si by $1 \times 10^{19}$ $cm^3$, for example. When the second nitride semiconductor layer 33 is a p-type semiconductor, the second nitride semiconductor layer 33 can be formed into a p-type by doping the same with Mg by $3 \times 10^{19}$ $cm^{-3}$, for example. The dopant concentration may be constant or may be nonuniform in the vertical direction to the substrate 11. The dopant concentration may be constant or may be nonuniform in the in-plane direction of the substrate 11. The second nitride semiconductor layer 33 may have a structure in which the Al composition ratio of AlGaN is graded. For example, the second nitride semiconductor layer 33 may have a layer structure in which the Al composition ratio of AlGaN is continuously or stepwisely changed from the minimum value z1 of the Al composition ratio x3 in the composition change layer 32 to 0.3. When the second nitride semiconductor layer 33 has the layer structure, the second nitride semiconductor layer 33 may not have a dopant or may be an undoped layer. The second nitride semiconductor layer 33 may have a laminated structure in which a layer having a high doping concentration is further provided in the top layer. The second nitride semiconductor layer 33 may have a laminated structure of two or more layers. In that case, the Al composition ratio preferably decreases toward the upper layer for the purpose of efficiently transporting carriers to the nitride semiconductor active layer 352.

(Second Nitride Semiconductor Layer)

Figure 8:
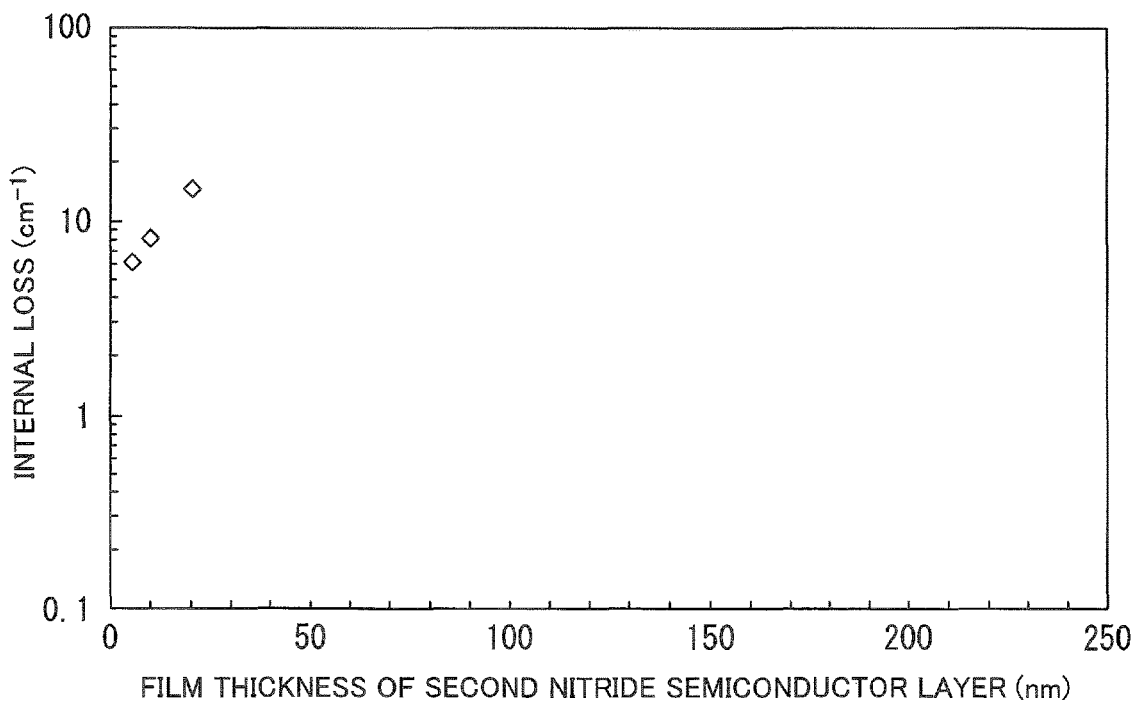
FIG. 8 is a graph illustrating an example of an internal loss to the film thickness of a second nitride semiconductor layer provided in the nitride semiconductor element according to the first embodiment of the present invention.

The film thickness of the second nitride semiconductor layer 33 is described using FIG. 8 referring to FIG. 1 and FIG. 2. FIG. 8 is a graph illustrating an example of simulation results of the internal loss to the film thickness of the second nitride semiconductor layer 33 provided in the nitride semiconductor element 1. In FIG. 8, the horizontal axis represents the film thickness (nm) of the second nitride semiconductor layer 33 and the vertical axis represents the internal loss ($cm^{-1}$). In the simulation results, the simulation was carried out based on a design in which the internal efficiency and the light confinement coefficient do not almost change, the mirror loss αm is constant at 34.3 $cm^{-1}$, and the film thickness of the nitride semiconductor active layer 352 is the same, and therefore the internal loss αi serves as a control factor of the oscillation threshold gain gth.

As illustrated in FIG. 8, the internal loss αi is higher as the film thickness of the second nitride semiconductor layer 33 is larger. The oscillation threshold gain gth of the nitride semiconductor element 1 is lower as the internal loss αi is lower. It is confirmed in an operation simulation of the nitride semiconductor element 1 that the nitride semiconductor element 1 oscillates when the film thickness of the second nitride semiconductor layer 33 is less than 100 nm. Furthermore, the nitride semiconductor element 1 may be provided with the second nitride semiconductor layer 33 in order to connect the composition change layer 32 and the first electrode 14 (see FIG. 1) with low resistance. Therefore, the nitride semiconductor element 1 may be provided with the second nitride semiconductor layer 33 laminated on the composition change layer 32 to be adjacent to the second composition change region 322 with the film thickness larger than 0 nm and less than 100 nm. The film thickness of the second nitride semiconductor layer 33 may be larger than 0 nm and smaller than 20 nm. Thus, the nitride semiconductor element 1 can achieve a reduction in the oscillation threshold gain gth. By keeping the film thickness of the second nitride semiconductor layer 33 in this range, the three-dimensional growth due to the lattice relaxation during the growth of the second nitride semiconductor layer 33 can be suppressed and the surface of the second nitride semiconductor layer 33 can be flattened. More specifically, the contact between the second nitride semiconductor layer 33 and the first electrode 14 can be achieved as designed, so that the nitride semiconductor element 1 having high reproducibility and a low driving voltage can be realized.

The Al composition ratio x2 of $Al_{x2}Ga_{(1-x2)}N$ of the formation material of the second nitride semiconductor layer 33 may satisfy the relationship of z1>x2+0.2 in the relationship with the Al composition ratio x3 (i.e., x3=z1) of $Al_{x3}Ga_{(1-x3)}N$ in an end portion of the second composition change region 322 on the side in contact with the second nitride semiconductor layer 33. More specifically, the Al composition ratio x2 of $Al_{x2}Ga_{(1-x2)}N$ may be larger than a value obtained by adding 0.2 to the Al composition ratio x3 (z3=z1) of $Al_{x3}Ga_{(1-x3)}N$ in the end portion of the second composition change region 322. Thus, a hole gas by the composition difference between the Al composition ratio x2 of $Al_{x2}Ga_{(1-x2)}N$ of the formation material of the second nitride semiconductor layer 33 and the Al composition ratio x3 of $Al_{x3}Ga_{(1-x3)}N$ of the formation material of the second composition change region 322 can be efficiently generated. When the nitride semiconductor element 1 is an ultraviolet light receiving/emitting element, the second nitride semiconductor layer 33 is formed with a low Al composition ratio in many cases, and thus an inhibitory effect of easily absorbing the target light is produced. In order to suppress the inhibitory effect, a method for increasing the Al composition ratio x3 of the second composition change region 322 to be higher than the Al composition ratio x of the nitride semiconductor active layer 352 and a method for reducing the Al composition ratio x2 of the second nitride semiconductor layer 33 to be lower than the Al composition ratio x of the nitride semiconductor active layer 352 in order to lower the contact resistance with the first electrode 14 are mentioned. In this case, also considering a manufacturing variation in controlling the composition of each layer, there is a necessity that the minimum value z1 of the Al composition ratio x3 of the second composition change region 322 is larger by 0.1 and the Al composition ratio x2 of the second nitride semiconductor layer 33 is lower by 0.1 than the Al composition ratio x of the nitride semiconductor active layer 352. In order to realize this configuration, the Al composition difference between the second composition change region 322 and the second nitride semiconductor layer 33 may be larger than 0.2.

The second nitride semiconductor layer 33 may have a configuration in which a plurality of layers is laminated. In this case, the Al composition ratio x2 of the second nitride semiconductor layer 33 indicates the composition ratio in the surface in contact with the outermost layer, i.e., first electrode 14.

The Al composition ratio x2 of $Al_{x2}Ga_{(1-x2)}N$ of the formation material of the second nitride semiconductor layer 33 may satisfy the relationship of x2=0. More specifically, the Al composition ratio x2 may be 0. The use of a p-type (p-)GaN in which the Al composition ratio x2 of $Al_{x2}Ga_{(1-x2)}N$ is 0 for the top layer of the second nitride semiconductor layer 33 enables a reduction in the contact resistance with the first electrode 14 disposed on the second nitride semiconductor layer 33. By the use of the p-type (p-)GaN in which the Al composition ratio x2 of $Al_{x2}Ga_{(1-x2)}N$ is 0 for the top layer of the second nitride semiconductor layer 33, the range of the Al composition ratio x3 of $Al_{x3}Ga_{(1-x3)}N$ as the formation material of the second composition change region 322 can be widely designed, and therefore the wavelength range of an ultraviolet light which can be dealt by the nitride semiconductor element 1 increases. In the nitride semiconductor element 1 according to this embodiment, the second nitride semiconductor layer 33 is configured from p-GaN.

Thus, the nitride semiconductor element 1 can generate a hole gas in the lamination interface between the second composition change region 322 of the composition change layer 32 and the second nitride semiconductor layer 33. Hence, a current (hole) can be caused to flow from the second nitride semiconductor layer 33 to the second composition change region 322 by energy obtained by the application of a voltage to the first electrode 14 effectively lower than an energy difference equivalent to a valence band energy level difference between the second composition change region 322 and the second nitride semiconductor layer 33.

(First Electrode)

The first electrode 14 is formed on the ridge portion semiconductor layer 17. As materials forming the first electrode 14 when the first electrode 14 is an n-type electrode, materials corresponding to an n-type electrode of a common nitride semiconductor light emitting element are usable when the first electrode 14 is used for the purpose of injecting electrons into the ridge portion semiconductor layer 17. For example, Ti, Al, Ni, Au, Cr, V, Zr, Hf, Nb, Ta, Mo, W, or an alloy thereof, ITO, or the like is applied as the formation materials when the first electrode 14 is an n-type electrode.

As materials forming the first electrode 14 when the first electrode 14 is a p-type electrode, the same materials as those of a p-type electrode layer of a common nitride semiconductor light emitting element are usable when the first electrode 14 is used for the purpose of injecting holes into the nitride semiconductor light emitting element 1. For example, Ni, Au, Pt, Ag, Rh, Pd, Cu, or an alloy thereof, ITO, or the like is applied as the formation materials when the first electrode 14 is a p-type electrode. When the first electrode 14 is a p-type electrode, Ni, Au, an alloy thereof, ITO, or the like having a low contact resistance between the first electrode 14 and the ridge portion semiconductor layer 17 may be acceptable. In this embodiment, the first electrode 14 is formed to be a p-type electrode.

The first electrode 14 may have a pad electrode thereon for the purpose of uniformly diffusing a current to the entire region of the first electrode 14. Examples of materials forming the pad electrode include Au, Al, Cu, Ag, W, or the like, for example. The pad electrode may be formed of Au having high conductivity among the materials from the viewpoint of conductivity. Specifically, as the structure of the first electrode 14, a structure is mentioned, for example, in which a second contact electrode made of an alloy of Ni and Au is formed on the ridge portion semiconductor layer 17 and a second pad electrode made of Au is formed on the second contact electrode. The first electrode 14 is formed with a thickness of 240 nm, for example.

In the case of a laser diode, the first electrode 14 may have a rectangular shape in which the short side length is less than 10 μm and the long side length is 1000 μm or less and may be laminated on the second nitride semiconductor layer 33. In the case of a light emitting diode, various shapes are assumed and a 50 m×200 μm rectangular shape or the like is assumed, for example. The mutual contact surface where the first electrode 14 and the ridge portion semiconductor layer 17 contact has almost the same shape. Therefore, the ridge portion semiconductor layer 17 has the rectangular shape in which the short side length is less than 10 μm and the long side length is 100 μm or less. Due to the fact that the mutual contact surface where the first electrode 14 and the ridge portion semiconductor layer 17 contact has the same shape, the diffusion of carriers injected from the first electrode 14 in the horizontal direction of the substrate 11 in the ridge portion semiconductor layer 17 is suppressed and light emission in the nitride semiconductor active layer 352 can be controlled.

(Second Electrode)

The second electrode 15 is formed on the second lamination portion 312 of the first nitride semiconductor layer 31. As materials forming the second electrode 15 when the second electrode 15 is an n-type electrode, materials corresponding to an n-type electrode of a common nitride semiconductor light emitting element are usable when the second electrode 15 is used for the purpose of injecting electrons into the first nitride semiconductor layer 31. For example, as the formation materials when the second electrode 15 is an n-type electrode, Ti, Al, Ni, Au, Cr, V, Zr, Hf, Nb, Ta, Mo, W, or an alloy thereof, ITO, or the like is applied.

As materials forming the second electrode 15 when the second electrode 15 is a p-type electrode, the same materials as those of a p-type electrode of a common nitride semiconductor light emitting element are usable when the second electrode 15 is used for the purpose of injecting holes into the first nitride semiconductor layer 31. For example, as the formation materials when the second electrode 15 is a p-type electrode, Ni, Au, Pt, Ag, Rh, Pd, Cu, or an alloy thereof, ITO, or the like is applied. When the second electrode 15 is a p-type electrode, Ni, Au, or an alloy thereof, ITO, or the like having a low contact resistance between the second electrode 15 and the second lamination portion 312 of the first nitride semiconductor layer 31 may be acceptable. In this embodiment, the second electrode 15 is formed to be an n-type electrode.

The second electrode 15 may have a pad electrode thereon for the purpose of uniformly diffusing a current to the entire region of the second electrode 15. Examples of materials forming the pad electrode include Au, Al, Cu, Ag, W, or the like, for example. The pad electrode may be made of Au with high conductivity among such materials from the viewpoint of conductivity. Specifically, as the structure of the second electrode 15, a structure is mentioned, for example, in which a first contact electrode made of an alloy of raw materials selected from Ti, Al, Ni, and Au is formed on the second lamination portion 312 of the first nitride semiconductor layer 31 and a first pad electrode made of Au is formed on the first contact electrode. The second electrode 15 is formed with a thickness of 60 nm, for example. In this embodiment, the second electrode 15 is formed with a thickness different from that of the first electrode 14. However, it is a matter of course that the second electrode 15 may be formed with the same thickness as that of the first electrode 14.

(Resonator Surface)

When the nitride semiconductor element 1 is applied to a laser diode, the formation of a resonator surface is required. The resonator surface 16a is configured by the same plane forming the side surfaces of the second lamination portion 312 of the first nitride semiconductor layer 31, the light emitting unit 35, the electron blocking layer 34, the composition change layer 32, and the second nitride semiconductor layer 33. The rear resonator surface 16b is configured by the same plane forming the side surfaces, which are the side surfaces opposing the resonator surface 16a, of the second lamination portion 312 of the first nitride semiconductor layer 31, the light emitting unit 35, the electron blocking layer 34, the composition change layer 32, and the second nitride semiconductor layer 33. The resonator surface 16a and the rear resonator surface 16b are provided for the purpose of reflecting light emitted from the light emitting unit 35. The resonator surface 16a and the rear resonator surface 16b are provided to form a pair in order to confine light reflected on the resonator surface 16a and the rear resonator surface 16b in the light emitting unit 35. The resonator surface 16a serves as the emission side of light of the nitride semiconductor element 1, for example. In order to reflect the light emitted from the light emitting unit 35 on the resonator surface 16a and the rear resonator surface 16b, the resonator surface 16a and the rear resonator surface 16b may be perpendicular and flat to the contact surface of the light emitting unit 35 and the upper guide layer 353. However, the resonator surface 16a and the rear resonator surface 16b may entirely or partially have an inclined portion or an irregular portion.

On the surfaces of the resonator surface 16a and the rear resonator surface 16b, an insulating protective film, such as a dielectric multilayer film, and a reflective film may be formed. Specifically, the insulating protective film may be made of $SiO_2$ and, in addition thereto, may be made of $Al_2O_3$, SiN, $SnO_2$, ZrO, $HfO_2$, or the like. The insulating protective film may have a structure in which the materials are laminated. The insulating protective film may be formed on the surfaces of both the resonator surface 16a serving as the light emission side and the rear resonator surface 16b on the reflection side not serving as the light emission side of the nitride semiconductor element 1. The insulating protective film formed on the resonator surface 16a on the light emission side and the insulating protective film formed on the rear resonator surface 16b on the light reflection side may have the same structure or may have different structures.

(Production Method)

The composition change layer 32 can be produced as follows. For example, AlGaN is grown by continuously increasing the flow rate of TMG (trimethyl gallium) which is a raw material gas, and then simultaneously supplying an ammonia gas while continuously reducing the flow rate of TMA (trimethyl aluminum) using a metal organic chemical vapor deposition apparatus (MOVPE apparatus). Thus, a composition change layer in which the Al composition ratio of AlGaN changed can be produced. At this time, Mg can be added as impurities into AlGaN by supplying Cp2Mg (cyclopentadienyl magnesium) simultaneously with the supply of the ammonia gas.

(Measurement Method)

In this embodiment, the materials and the compositions are specified by energy dispersive X-ray spectrometry (EDX). The cross section perpendicular to the lamination direction of each layer is divided, polished, or subjected to focused ion beam (FIB) processing, and then the cross section is observed using a transmission electron microscope (TEM), whereby the arrangement of each layer is clarified and identified by the energy dispersive X-ray spectrometry (EDX) enabling point analysis.

The film thickness of a semiconductor thin film is measured by performing dividing, polishing, or focused ion beam processing of the cross section perpendicular to the thin film lamination direction, and then observing the cross section under a transmission electron microscope.

As described above, the nitride semiconductor element 1 according to this embodiment is provided with the nitride semiconductor active layer 352 made of $Al_xGa_{(1-x)}N$ and the composition change layer 32 made of $Al_{x3}Ga_{(1-x3)}N$ in which the Al composition ratio x3 decreases in a direction away from the nitride semiconductor active layer 352. The composition change layer 32 has the first composition change region 321 having a thickness larger than 0 nm and smaller than 400 nm and the second composition change region 322 which is a region further away from the nitride semiconductor active layer 352 than the first composition change region 321 and in which the change rate of the Al composition ratio x3 in the thickness direction of the film thickness of the composition change layer 32 is higher than that of the first composition change region 321.

The nitride semiconductor element 1 provided with the configuration can achieve an improvement of the maximum current density and a reduction in the voltage at the maximum current. Thus, the nitride semiconductor element 1 can suppress the element breakdown even under a high current density.

Second Embodiment

Figure 9:
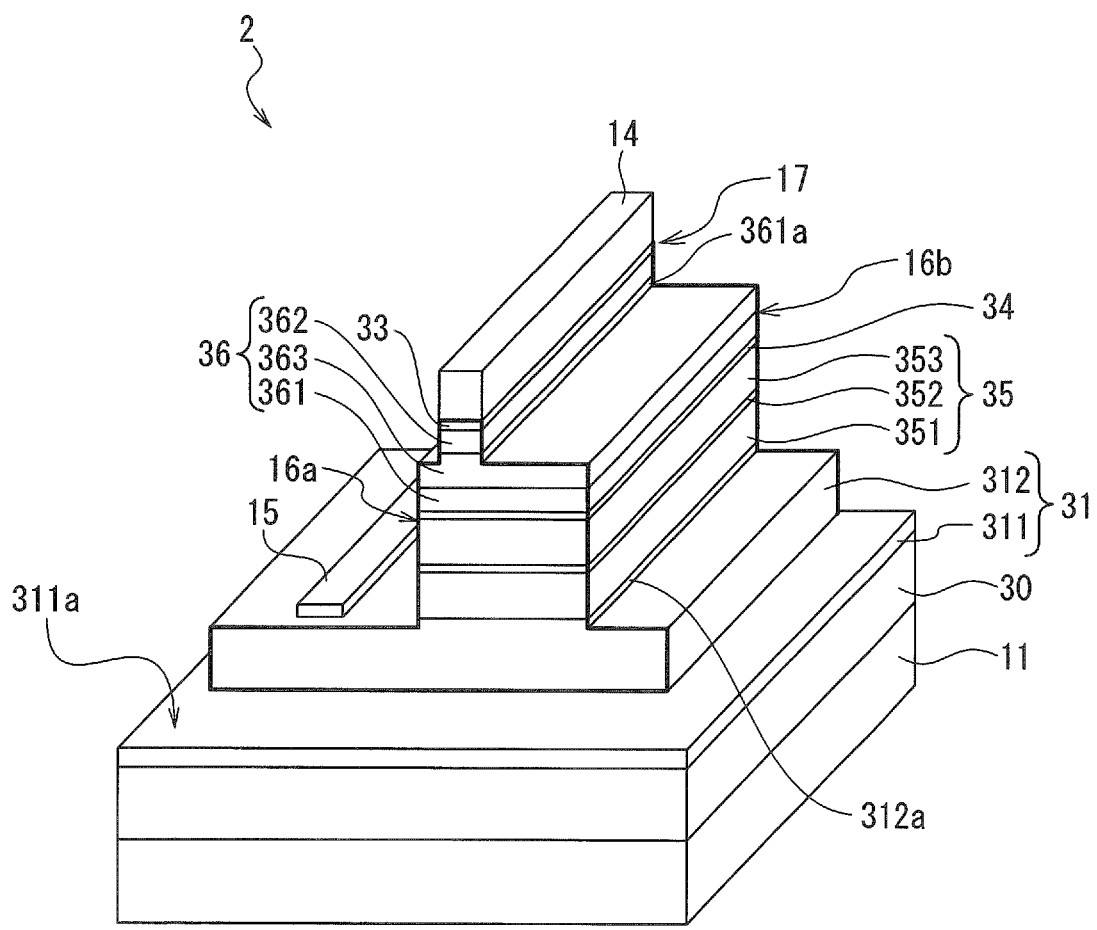
FIG. 9 is a perspective view schematically illustrating an example of the schematic configuration of a nitride semiconductor element according to a second embodiment of the present invention.
Figure 10:
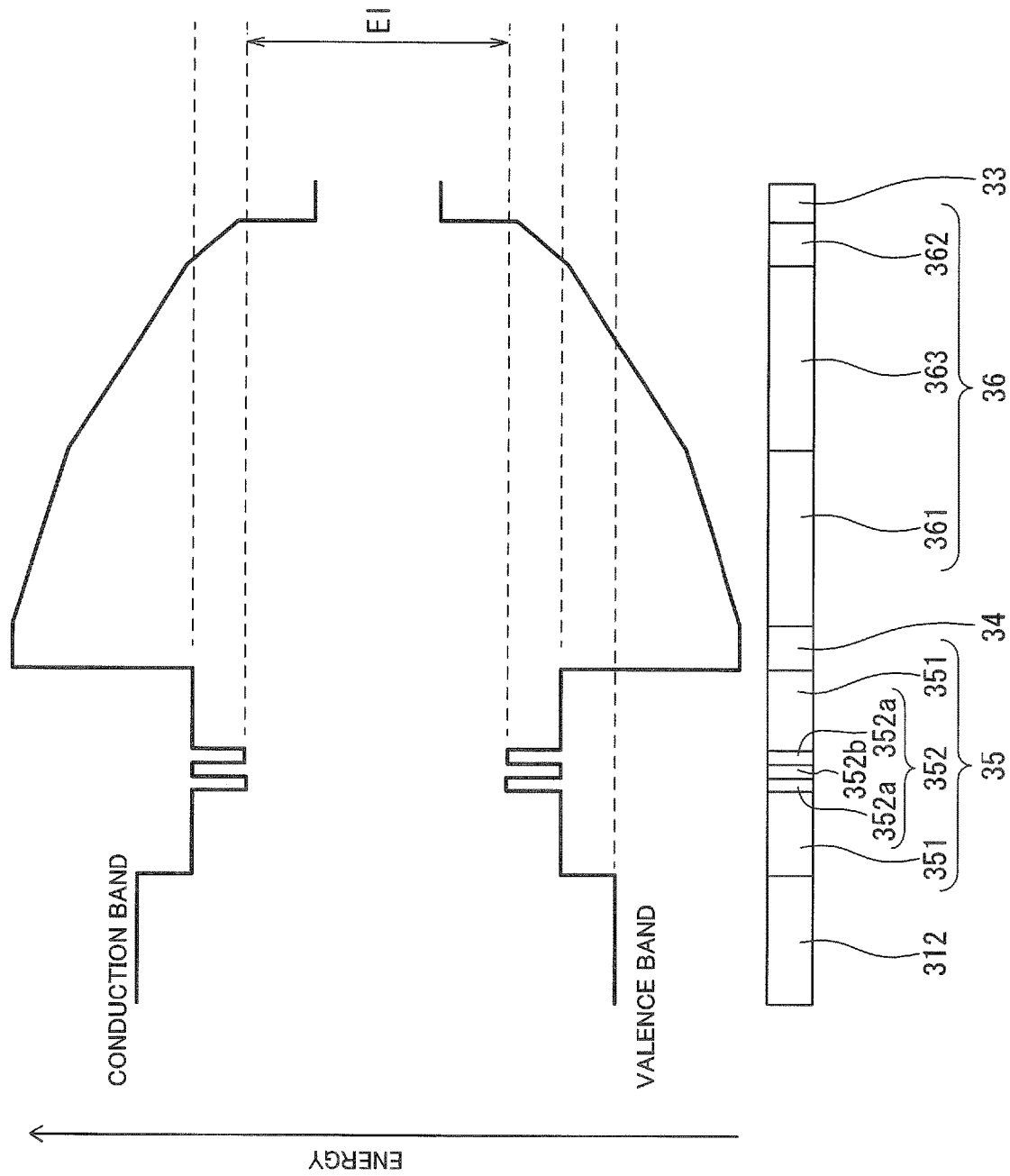
FIG. 10 is a figure schematically illustrating an example of an energy band of the nitride semiconductor element according to the second embodiment of the present invention.

A nitride semiconductor element according to a second embodiment of the present invention is described using FIG. 9 and FIG. 10. A nitride semiconductor element 2 according to this embodiment has a feature that the configuration of a composition change layer is different from that of the nitride semiconductor element 1 according to the first embodiment. Therefore, with respect to the constituent components of the nitride semiconductor element 2, the same reference numerals are attached to constituent components exhibiting the same operations and functions as those of the constituent components of the nitride semiconductor element 1 and a description thereof is omitted.

FIG. 9 is a perspective view schematically illustrating an example of the schematic configuration of the nitride semiconductor element 2 according to this embodiment. FIG. 10 is a figure for describing the band gap structure of the nitride semiconductor element 2 having a laminated structure in which nitride semiconductors are laminated. In the upper side in FIG. 10, the energy diagrams of the conduction band and the valence band of the nitride semiconductor element 2 are schematically illustrated. In the lower side in FIG. 10, the laminated structure of the nitride semiconductor element 2 is schematically illustrated in associated with the band gap structure. FIG. 10 schematically illustrates well layers 352a and a barrier layer 352b configuring a nitride semiconductor active layer 352. In FIG. 10, the illustration of a barrier layer provided between a lower guide layer 351 and the well layer 352a and a barrier layer provided between an upper guide layer 353 and the well layer 352a is omitted.

As illustrated in FIG. 9 and FIG. 10, the nitride semiconductor element 2 is provided with a composition change layer 36 having three regions different in the change rate of the Al composition ratio. The composition change layer 36 has, in a region between a first composition change region 361 and a second composition change region 362, a third composition change region 363 in which the change rate of the Al composition ratio x3 is different from that of the second composition change region 362. The third composition change region 363 is configured so that the average Al composition ratio x3 is lower than that of the first composition change region 361 and the average the Al composition ratio x3 is higher than that of the second composition change region 362.

As illustrated in FIG. 9, the third composition change region 363 is formed on a projection portion 361a formed in the first composition change region 361. The second composition change region 362 is formed on the third composition change region 363. A second nitride semiconductor layer 33 is formed on the second composition change region 362. A ridge portion semiconductor layer 17 contains the projection portion 361a formed in the first composition change region 361, the third composition change region 363, the second composition change region 362, and the second nitride semiconductor layer 33. However, as described in the first embodiment, the projection portion 361a (ridge portion) aims at concentrating a current, and therefore may contain a nitride semiconductor active layer 352 which is a light emitting layer or may contain a first nitride semiconductor layer 31. Alternatively, the nitride semiconductor element 2 may have a structure in which the projection portion 361a is not provided from the first, the composition change layer 36 is formed with the same area as that of a mesa portion, and the size of the first electrode 14 is designed to an appropriate value, whereby a current is concentrated.

Due to the fact that the composition change layer 36 has the third composition change region 363, when the first composition change region 361, the third composition change region 363, and the second composition change region 362 are arranged adjacent to each other in this order, the boundary where the change rate of the Al composition ratio x3 changes is generated between an end portion of the first composition change region 361 on the side in which the nitride semiconductor active layer 352 is arranged and an end portion of the second composition change region 362 on the side in which the nitride semiconductor active layer 352 is arranged as illustrated in FIG. 10. Thus, the nitride semiconductor element 2 can achieve an improvement of light confinement. The composition change rate is preferably higher in the third composition change region 363 than in the second composition change region 362 and higher in the first composition change region 361 than in the third composition change region 363. Thus, the average Al composition ratio of the second composition change region 362 and the third composition change region 363 is higher than that when layers of the second composition change region 362 and the third composition change region 363 are formed with the change rate (gradient rate) of the second composition change region 362, so that the confinement efficiency of light is improved. The Al composition ratio at the inflection surface between the second composition change region 362 and the third composition change region 363 is preferably higher by 0.1 or more than the Al composition ratio at the inflection surface between the third composition change region 363 and the first composition change region 361. Due to having the structure, the nitride semiconductor element 2 suppresses an increase in the driving voltage or an increase in the element breakdown rate resulting from increasing the film thickness of the second composition change region 362 more than necessary. Due to having the third composition change region 363, the nitride semiconductor element 2 can achieve both light confinement and the realization of a high current density.

In this embodiment, although the first composition change region 361 and the third composition change region 363 are formed in contact with each other and the third composition change region 363 and the second composition change region 362 are formed in contact with each other, the nitride semiconductor element 2 may have intermediate layers between the first composition change region 361 and the third composition change region 363 and between the third composition change region 363 and the second composition change region 362. The intermediate layer may have $Al_wGa_{1-w}N$ (0<w<1) in which the composition does not change, a structure in which $Al_wGa_{1-w}N$ in which the composition does not change and $Al_vGa_{1-v}N$ (0<v<w<1) in which the composition does not change are laminated (corresponding to a superlattice structure in the case of a multistage structure) or the like, for example. As examples of the Al composition ratio w and the Al composition ratio v, w may be 0.6 and v may be 0.4. When the intermediate layer has the laminated structure, the Al composition ratio v and the Al composition ratio w may be the same as or may be different from a value of the Al composition ratio at the end point of each of the composition change regions from the viewpoint of not forming an energy barrier. When there is a difference in the Al composition ratio values, a structure in which the Al composition ratio decreases toward the upper layer is preferable from the viewpoint of efficiently transporting carriers to a light emitting layer. The intermediate layers may have the same conductivity type as that of the first composition change region 361, the third composition change region 363, and the second composition change region 362. The intermediate layers may be a p-type semiconductor, may be an n-type semiconductor, or may be undoped. Also in this embodiment, due to the fact that the composition change layer 36 has the intermediate layers, the same operations and effects as those when the composition change layer 32 in the first embodiment has the intermediate layer are obtained.

As described above, the nitride semiconductor element 2 according to this embodiment is provided with the nitride semiconductor active layer 352 made of $Al_xGa_{(1-x)}N$ and the composition change layer 36 made of $Al_{x3}Ga_{(1-x3)}N$ in which the Al composition ratio x3 decreases in a direction away from the nitride semiconductor active layer 352. The composition change layer 36 has the first composition change region 361 having a thickness larger than 0 nm and smaller than 400 nm and the second composition change region 362 which is a region further away from the nitride semiconductor active layer 352 than the first composition change region 361 and in which the change rate of the Al composition ratio x3 in the thickness direction of the film thickness of the composition change layer 36 is higher than that of the first composition change region 361.

The nitride semiconductor element 2 provided with the configuration can achieve an improvement of the maximum current density and a reduction in the voltage at the maximum current. Thus, the nitride semiconductor element 2 can realize a high current density.

Furthermore, the composition change layer 36 provided in the nitride semiconductor element 2 has the third composition change region 363 in which the change rate of the Al composition ratio x3 is different from that of the second composition change region 362 in a region between the first composition change region 361 and the second composition change region 362. The third composition change region 363 is configured so that the average the Al composition ratio x3 is lower than that of the first composition change region 361 and the average the Al composition ratio x3 is higher than that of the second composition change region 362. Thus, a low driving voltage and a high current density without causing element breakdown can be realized and the laser oscillation threshold can be reduced without increasing the thickness of the first composition change region 361 more than necessary.

The present invention is not limited to the first embodiment and the second embodiment and can be variously altered. In the first embodiment and the second embodiment, the nitride semiconductor active layer is made of AlGaN but the present invention is not limited thereto. For example, even when the nitride semiconductor active layer is made of AlInGaN or BAlGaN, the same effects as those of the embodiments above are obtained.

The technical scope of the present invention is not limited to the illustrated and described exemplary embodiments and includes all embodiments that produce advantageous effects equivalent to those intended by the present invention. Furthermore, the technical scope of the present invention is not limited to the combinations of the features of the present invention defined by Claims and can be defined by every desired combination of specific features among all the individual features disclosed herein.

1, 2 nitride semiconductor element
11 substrate
14 first electrode
15 second electrode
16a resonator surface
16b rear resonator surface
17 ridge portion semiconductor layer
31 first nitride semiconductor layer
32, 36 composition change layer
33 second nitride semiconductor layer
34 electron blocking layer
35 light emitting unit
311 first lamination portion
311a upper surface
312 second lamination portion
321, 361 first composition change region
312a, 321a, 361a projection portion
322, 362 second composition change region
351 lower guide layer
352 nitride semiconductor active layer
353 upper guide layer
352a well layer
352b barrier layer

What is claimed is:

1. A nitride semiconductor element comprising:
   an active layer; and
   a composition change layer formed above the active layer and made of AlGaN in which an Al composition ratio decreases in a direction away from the active layer, wherein
   the composition change layer has
   a first composition change region having a thickness larger than 0 nm and smaller than 400 nm and
   a second composition change region which is a region further away from the active layer than the first composition change region and in which a change rate of the Al composition ratio in a thickness direction of a film thickness of the composition change layer is higher than the change rate of the Al composition ratio of the first composition change region, and
   in the first composition change region, the Al composition ratio continuously changes in the thickness direction of the film thickness.

2. The nitride semiconductor element according to claim 1, wherein
   in the second composition change region, the Al composition ratio continuously changes in the thickness direction of the film thickness.

3. The nitride semiconductor element according to claim 1, wherein
   the composition change layer has a third composition change region having a change rate of the Al composition ratio different from the change rate of the Al composition ratio of the second composition change region in a region between the first composition change region and the second composition change region, and
   in the third composition change region, an average Al composition ratio is lower than the average Al composition ratio of the first composition change region and the average Al composition ratio is higher than the average Al composition ratio of the second composition change region.

4. The nitride semiconductor element according to claim 1, wherein
in an end portion of the second composition change region on a side opposite to a side in which the active layer is arranged, the Al composition ratio is 0 or more and less than 0.5.

5. The nitride semiconductor element according to claim 1, comprising:
a first nitride semiconductor layer made of AlGaN on a side where the composition change layer is not disposed among both sides of the active layer, wherein
in the first nitride semiconductor layer, the Al composition ratio is higher than the Al composition ratio of an end portion of the first composition change region on the side opposite to a side in which the active layer is arranged.

6. The nitride semiconductor element according to claim 1, wherein
the active layer has a well layer and a barrier layer provided adjacent to the well layer, wherein
in the second composition change region, the Al composition ratio in an entire region is equal to or higher than the Al composition ratio of the well layer.

7. The nitride semiconductor element according to claim 1, wherein
Mg is injected into the first composition change region.

8. The nitride semiconductor element according to claim 1 comprising:
a guide layer provided between the active layer and the composition change layer and made of AlGaN, wherein
in the end portion of the first composition change region on the side opposite to a side in which the active layer is arranged, the Al composition ratio is equal to or higher than the Al composition ratio of the guide layer.

9. The nitride semiconductor element according to claim 1 comprising:
a second nitride semiconductor layer laminated on the composition change layer to be adjacent to the second composition change region with a film thickness larger than 0 nm and less than 100 nm.

10. The nitride semiconductor element according to claim 1, wherein
the second composition change region has a thickness larger than 0 nm and smaller than 200 nm.

11. The nitride semiconductor element according to claim 2, wherein
the composition change layer has a third composition change region having a change rate of the Al composition ratio different from the change rate of the Al composition ratio of the second composition change region in a region between the first composition change region and the second composition change region, and
in the third composition change region, an average Al composition ratio is lower than the average Al composition ratio of the first composition change region and the average Al composition ratio is higher than the average Al composition ratio of the second composition change region.

12. The nitride semiconductor element according to claim 2, wherein
in an end portion of the second composition change region on a side opposite to a side in which the active layer is arranged, the Al composition ratio is 0 or more and less than 0.5.

13. The nitride semiconductor element according to claim 3, wherein
in an end portion of the second composition change region on a side opposite to a side in which the active layer, the Al composition ratio is 0 or more and less than 0.5.

14. The nitride semiconductor element according to claim 2, comprising:
a first nitride semiconductor layer made of AlGaN on a side where the composition change layer is not disposed among both sides of the active layer, wherein
in the first nitride semiconductor layer, the Al composition ratio is higher than the Al composition ratio of an end portion of the first composition change region on the side opposite to a side in which the active layer is arranged.

15. The nitride semiconductor element according to claim 3, comprising:
a first nitride semiconductor layer made of AlGaN on a side where the composition change layer is not disposed among both sides of the active layer, wherein
in the first nitride semiconductor layer, the Al composition ratio is higher than the Al composition ratio of an end portion of the first composition change region on the side opposite to a side in which the active layer is arranged.

16. The nitride semiconductor element according to claim 4, comprising:
a first nitride semiconductor layer made of AlGaN on a side where the composition change layer is not disposed among both sides of the active layer, wherein
in the first nitride semiconductor layer, the Al composition ratio is higher than the Al composition ratio of an end portion of the first composition change region on the side opposite to a side in which the active layer is arranged.

17. The nitride semiconductor element according to claim 2, wherein
the active layer has a well layer and a barrier layer provided adjacent to the well layer, wherein
in the second composition change region, the Al composition ratio in an entire region is equal to or higher than the Al composition ratio of the well layer.

18. The nitride semiconductor element according to claim 3, wherein
the active layer has a well layer and a barrier layer provided adjacent to the well layer, wherein
in the second composition change region, the Al composition ratio in an entire region is equal to or higher than the Al composition ratio of the well layer.

19. The nitride semiconductor element according to claim 4, wherein
the active layer has a well layer and a barrier layer provided adjacent to the well layer, wherein
in the second composition change region, the Al composition ratio in an entire region is equal to or higher than the Al composition ratio of the well layer.

20. The nitride semiconductor element according to claim 5, wherein
the active layer has a well layer and a barrier layer provided adjacent to the well layer, wherein
in the second composition change region, the Al composition ratio in an entire region is equal to or higher than the Al composition ratio of the well layer.

* * * * *